United States Patent
Tachibana et al.

(10) Patent No.: US 8,456,235 B2
(45) Date of Patent: Jun. 4, 2013

(54) REGULATOR CIRCUIT

(75) Inventors: Suguru Tachibana, Kawasaki (JP); Kenta Aruga, Kawasaki (JP); Tatsuo Kato, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/535,184

(22) Filed: Aug. 4, 2009

(65) Prior Publication Data
US 2010/0156533 A1    Jun. 24, 2010

Related U.S. Application Data

(62) Division of application No. 11/589,140, filed on Oct. 30, 2006, now Pat. No. 7,586,371.

(30) Foreign Application Priority Data

Jun. 20, 2006 (JP) ................................ 2006-170741

(51) Int. Cl.
*H03F 3/45* (2006.01)

(52) U.S. Cl.
USPC .......... 330/253; 330/252; 330/259; 323/280; 323/312; 323/313; 323/314

(58) Field of Classification Search
USPC ............... 323/267, 268, 269, 270, 280, 311, 323/312, 313; 330/253, 252, 251, 257, 259, 330/260

See application file for complete search history.

(56) References Cited

U.S. PATENT DOCUMENTS

| 5,030,922 | A | | 7/1991 | Rumreich et al. |
| 5,187,448 | A | * | 2/1993 | Brooks et al. .................. 330/258 |
| 5,221,909 | A | * | 6/1993 | Cole .............................. 330/253 |
| 5,621,358 | A | | 4/1997 | Pisati et al. |
| 5,936,466 | A | * | 8/1999 | Andoh et al. .................. 330/253 |
| 6,175,223 | B1 | | 1/2001 | Martinez et al. |
| 6,201,375 | B1 | * | 3/2001 | Larson et al. .................. 323/280 |
| 6,246,221 | B1 | | 6/2001 | Xi |

(Continued)

FOREIGN PATENT DOCUMENTS

| JP | 8-272461 A | 10/1996 |
| JP | 9-81250 A | 3/1997 |

(Continued)

OTHER PUBLICATIONS

K.N. Leung, et al.; "A Capacitor-Free CMOS Low-Dropout Regulator With Damping-Factor-Control Frequency Compensation"; IEEE Journal of Solid-State Circuits; Oct. 2003; pp. 1691-1702; vol. 38; No. 10.

(Continued)

*Primary Examiner* — Nguyen Tran
(74) *Attorney, Agent, or Firm* — Arent Fox LLP

(57) ABSTRACT

The present invention is contrived to adopt a differential pair type amplifier circuit comprising a differential pair constituted by a first transistor receiving an input of a first signal and by a second transistor receiving an input of a third signal generated by outputting a second signal of which the voltage level is a power supply voltage. Elements requiring a matching are two transistors constituting the differential pair for the amplifier circuit. Because of this, the elements requiring a matching can be placed close to each other regardless of a layout between the amplifier circuits.

8 Claims, 21 Drawing Sheets

U.S. PATENT DOCUMENTS

| | | |
|---|---|---|
| 6,285,246 B1 | 9/2001 | Basu |
| 6,300,749 B1 | 10/2001 | Castelli et al. |
| 6,388,433 B2 | 5/2002 | Marty |
| 6,847,260 B2 | 1/2005 | Gupta et al. |
| 7,053,712 B2 | 5/2006 | Bonaccio et al. |
| 7,327,125 B2 | 2/2008 | Benbrik |
| 2004/0104711 A1* | 6/2004 | Scoones et al. ............... 323/280 |
| 2005/0040806 A1* | 2/2005 | Fernald ......................... 323/313 |
| 2005/0184711 A1 | 8/2005 | Chen et al. |
| 2005/0189932 A1 | 9/2005 | Itoh |

FOREIGN PATENT DOCUMENTS

| | | |
|---|---|---|
| JP | 11-15540 A | 1/1999 |
| JP | 2002-157031 A | 5/2002 |
| JP | 2003-5846 A | 1/2003 |
| JP | 2004-5670 A | 1/2004 |
| JP | 2004-504660 A | 2/2004 |
| JP | 2004-152891 A | 5/2004 |
| JP | 2005-92401 A | 4/2005 |
| JP | 2005-202781 A | 7/2005 |
| JP | 2005-242665 A | 9/2005 |
| JP | 2005-276190 A | 10/2005 |
| WO | WO 02/06915 A2 | 1/2002 |

OTHER PUBLICATIONS

P. Hazucha et al.; "Area-Efficient Linear Regulator With Ultra-Fast Load Regulation"; IEEE Journal of Solid-State Circuits; Apr. 2005; pp. 933-940; vol. 40; No. 4.

H. Banba et al.; "A CMOS Bandgap Reference Circuit with Sub-1-V Operation"; IEEE Journal of Solid-State Circuits; May 1999; pp. 670-674; vol. 34; No. 5.

Japanese Office Action dated Aug. 16, 2011 issued in Japanese Application No. 2006-170741 with a Partial English-language Translation.

* cited by examiner

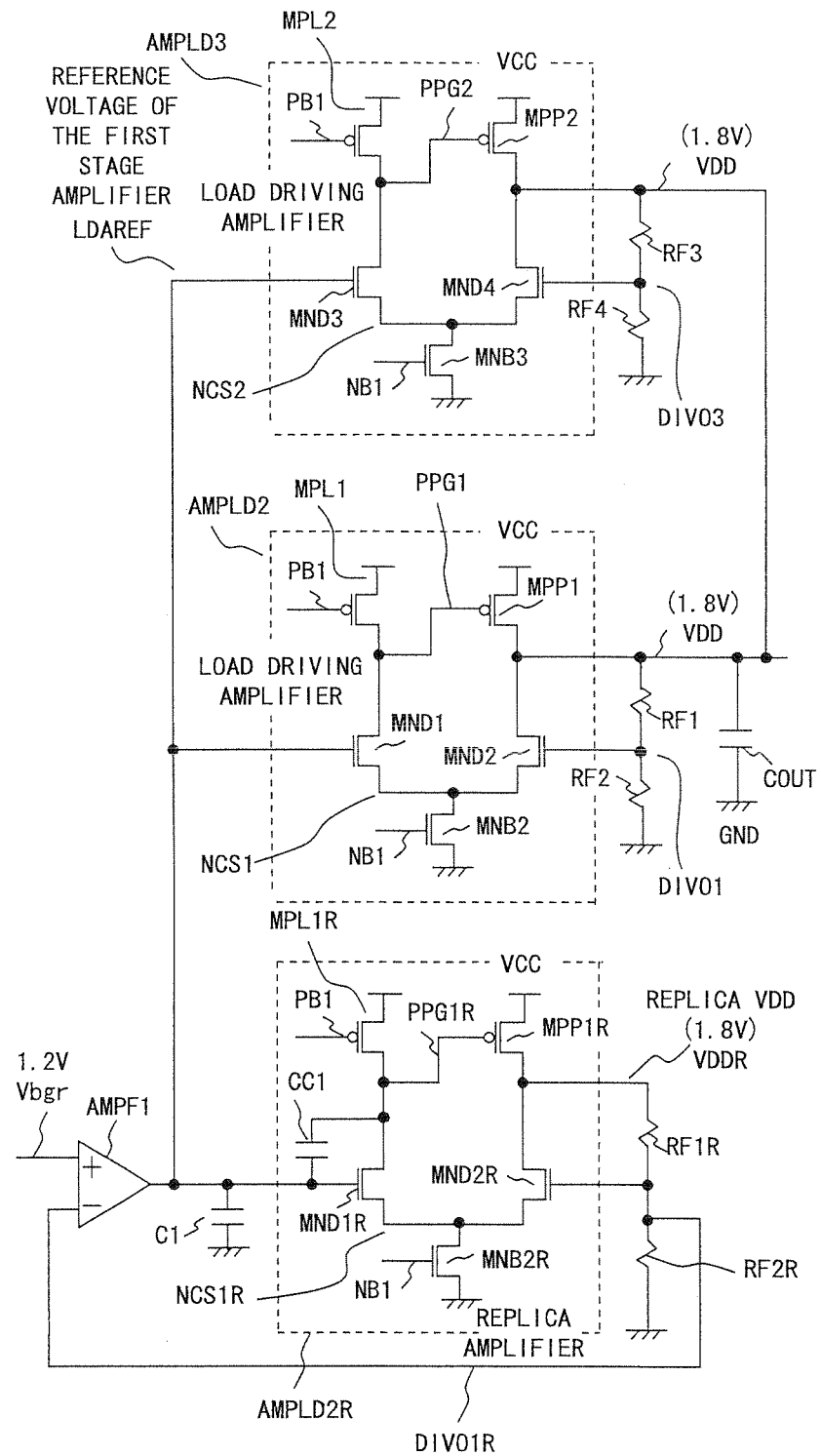
F I G. 8

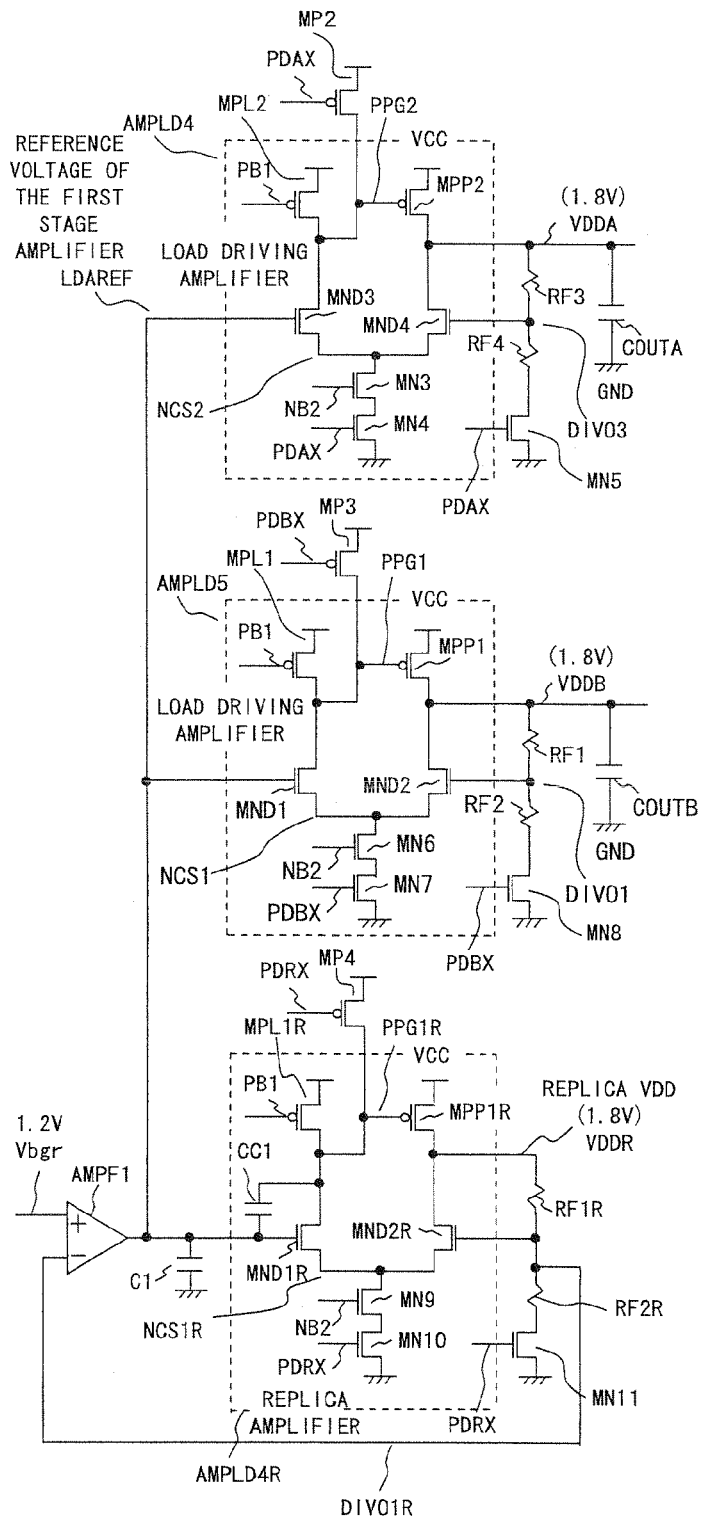
F I G. 10

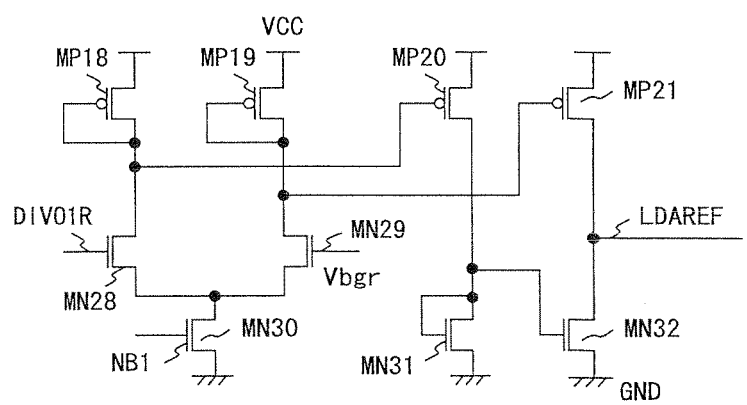
F I G. 14

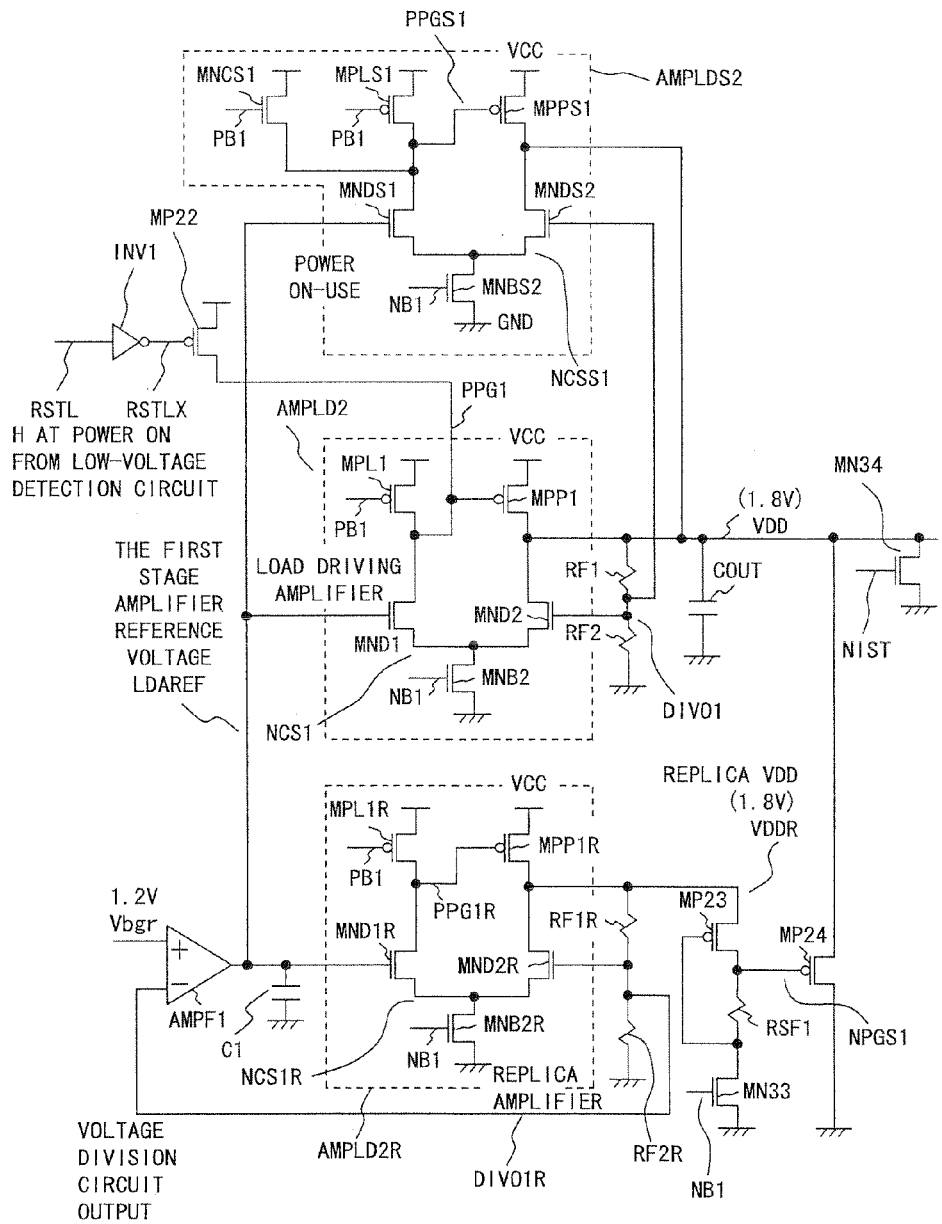
F I G. 15

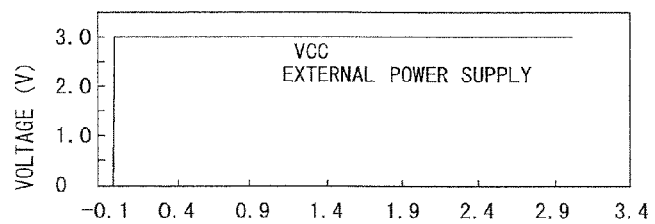
F I G. 1 8 A
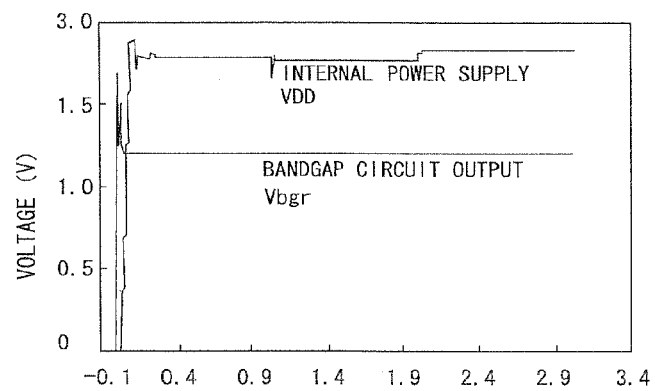
F I G. 1 8 B
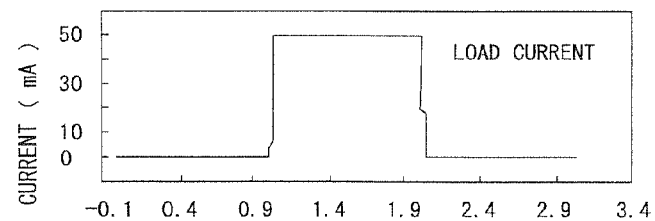
F I G. 1 8 C
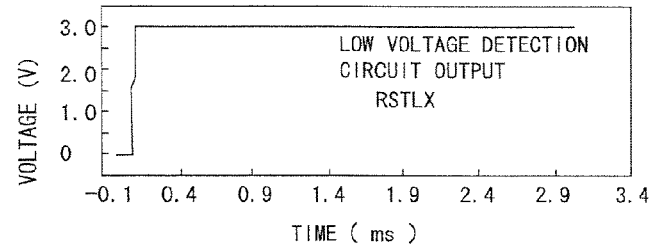
F I G. 1 8 D

REGULATOR CIRCUIT

CROSS REFERENCE TO RELATED APPLICATIONS

This application is based upon and claims the benefit of priority from the prior Japanese Patent Application No. 2006-170741 filed on Jun. 20, 2006, the entire contents of which are incorporated herein by reference.

BACKGROUND OF THE INVENTION

1. Field of the Invention

The present invention relates to a regulator circuit capable of responding to a variation of a load current.

2. Description of the Related Art

An integrated circuit, such as a micro controller unit (MCU), equipped onto a semiconductor chip is sometimes configured such that a regulator circuit is also equipped onto the semiconductor chip and the regulator circuit supplies the integrated circuit with a voltage lower than an external power supply which is externally applied. The reasons include an inability of applying a high voltage to a digital circuit (i.e., an internal power supply voltage must be reduced) because a withstand voltage of elements constituting the circuit is reduced with miniaturization, and a suppression of a consumption power during operation and standby, et cetera. A representative example is a circuit reducing an internal power supply voltage to 1.8 volts from the external power supply voltage of 3.3 volts.

FIG. 1 shows a configuration of a regulator circuit according to a first conventional example. The circuit is one shown in FIG. 1 of "A Capacitor-Free CMOS Low-Dropout Regulator With Damping-Factor-Control Frequency Compensation" authored by K. N. Leung, et al; IEEE Journal of Solid-State Circuits, vol. 38, No. 10, p.p. 1691-1702; October 2003 (noted as "non-patent document 1" hereinafter). In the showing of FIG. 1 herein, an RF1 and RF2 are resistors, an AMP1 is an operational amplifier circuit, a GND is a ground (i.e., a ground terminal), a VCC is an external power supply voltage (e.g., 3.3 volts), an AMPO1 is an output signal of the operational amplifier circuit AMP1, an IB1 is a current source for generating a bias current, an MPB and MPP1 are P-channel MOS FET (noted as "PMOS transistor" hereinafter), a VDD is an internal power supply voltage, a COUT is a capacitor for stabilizing the internal power supply voltage, a DIVO1 is an output signal of a voltage division circuit constituted by the resistors RF1 and RF2, a PPG1 is a signal input to the gate of the PMOS transistor MPP1, and a Vbgr is a reference voltage applied to an inverting input terminal of the operational amplifier circuit AMP1. The component signs such as RF1 and RF2 are also used as symbols indicating characteristic values (e.g., a resistance value, capacitance value or voltage values) of elements. The similar terminologies are used hereinafter.

An output signal DIVO1 is input to a non-inverting input terminal of the operational amplifier circuit AMP1. By this, the operational amplifier circuit AMP1 outputs, to the gate of the PMOS transistor MPB, an output signal AMPO1 of a voltage according to the difference between a voltage value of the output signal DIVO1 and that of a reference voltage Vbgr. The PMOS transistor MPB and current source IB1 function as source follower circuit and outputs an output signal PPG1 which is shifted from a potential of the output signal AMPO1 by a potential equivalent to a threshold voltage (Vth) of the PMOS transistor MPB. The source follower circuit also functions as buffer circuit for driving a load capacitance of the PMOS transistor MPP1.

An external power supply voltage VCC is applied to the source of the PMOS transistor MPP1 and the drain thereof is connected to the resistor RF1 and the capacitor COUT. The other terminal of the capacitor COUT is connected to the ground GND, and a voltage across the terminals of the capacitor COUT is the internal power supply voltage VDD. The other terminal of the resistor RF1 is individually connected to the resistor RF2 and the non-inverting input terminal of the operational amplifier circuit AMP1, and the other terminal of the resistor RF2 is connected to the ground GND. By this, the division circuit outputs, as an output signal DIVO1, a signal obtained by dividing the internal power supply voltage VDD by the respective resistance values of the resistors RF1 and RF2, that is, a signal of a voltage value of VDD·RF2/(RF1+RF2).

The next is a specific description on an operation associated with a fluctuation of the internal power supply voltage VDD according to the above noted first conventional example.

With a fluctuation of the internal power supply voltage VDD, a voltage value of an output signal DIVO1 fluctuates. If a voltage value of the output signal DIVO1 becomes higher than a voltage value of the reference voltage Vbgr due to a fluctuation of the internal power supply voltage VDD, a voltage value of an output signal AMPO1 of the operational amplifier circuit AMP1 becomes large. As a result, a source potential of the PMOS transistor MPB, that is, a voltage value of a signal PPG1 input to the gate of the PMOS transistor MPP1, increases, resulting in decreasing a current flowing between the source and drain, and decreasing a potential of the internal power supply voltage VDD, which in turn decreases a potential of the output signal DIVO1.

Contrarily, if a voltage value of the output signal DIVO1 becomes lower than a voltage value of the reference voltage Vbgr due to a fluctuation of the internal power supply voltage VDD, a voltage value of an output signal AMPO1 of the operational amplifier circuit AMP1 becomes small. As a result, a voltage value of a signal PPG1 input to the gate of the PMOS transistor MPP1 decreases, resulting in increasing a current flowing between the source and drain, and increasing a potential of the internal power supply voltage VDD, which in turn increases a potential of the output signal DIVO1.

As such, the first conventional example comprises a feedback circuit for controlling a voltage value of the internal power supply voltage VDD so that a voltage value of the output signal DIVO1 is identical with that of a reference voltage Vbgr. This makes it possible to maintain the voltage value of the internal power supply voltage VDD at 1.8 volts if the reference voltage Vbgr has the voltage value of 1.2 volts and the resistors RF1 and RF2 of resistance values are adopted so that the voltage value of the output signal DIVO1 becomes two thirds (⅔) of that of the internal power supply voltage VDD.

The above noted feedback circuit is constituted by the entire circuit of the first conventional example, including the capacitor COUT in the feedback loop. This has caused a difficulty in maintaining a balance between a stability of the loop and a response characteristic for keeping track of potentials of the signals AMPO1 and PPG1 in high speed in response to a voltage fluctuation of the internal power supply voltage VDD.

FIG. 2 shows a configuration of a regulator circuit according to a second conventional example. The circuit is configured to maintain the stability and high speed response, which is shown in FIG. 3 of the non-patent document 1. In the showing of FIG. 2 herein, an RF1 and RF2 are resistors, an AMP1 is an operational amplifier circuit, an AMP2 and DFC are amplifier circuits for amplifying an input signal by being non-inverted, a DFCO is an output signal of the amplifier circuit DFC, a GND is a ground (i.e., a ground terminal), a VCC is an external power supply voltage, an AMPO1 is an output signal of the operational amplifier circuit AMP1, an MPP1 is a PMOS transistor, a VDD is an internal power supply voltage, a COUT is a capacitor for stabilizing the internal power supply voltage, a DIVO1 is an output signal of a voltage division circuit constituted by the resistors RF1 and RF2, a CF is a capacitor for adding a capacitance to the voltage division circuit, a CM1 and CM2 are capacitors for a phase compensation, a PPG1 is a signal input to the gate of the PMOS transistor MPP1, a Vbgr is a reference voltage applied to an inverting input terminal of the operational amplifier circuit AMP1.

The next is a specific description of an operation associated with a fluctuation of the internal power supply voltage VDD according to the above noted second conventional example.

The second conventional example is configured to have the amplifier circuit AMP2 amplify an output signal AMPO1 with the same polarity and input the amplified signal to the gate of the PMOS transistor MPP1 as a signal PPG1. This makes the individual signals AMPO1, PPG1, VDD and DIVO1 change approximately in the same manner as in the case of the first conventional example shown in FIG. 1 according to the relationship of a potential between the signals Vbgr and DIVO1. The function of a feedback circuit comprised by the second conventional example is for controlling a voltage value of the internal power supply voltage VDD so that a voltage value of the output signal DIVO1 is identical with that of the reference voltage Vbgr in the same manner as the first conventional example.

An expression representing a transfer characteristic of an open loop gain for the second conventional example results in including three poles since the three amplification stages, i.e., the operational amplifier circuit AMP1, amplifier circuit AMP2, and PMOS transistor MPP1, are serially connected with one another. Meanwhile, the feedback circuit comprises the resistors RF1 and RF2, and the capacitor CF. According to this, it is apparent that one zero-point created by the capacitor CF is included, when considering a transfer characteristic of the loop (i.e., the part from an input into the operational amplifier circuit AMP1 to an output of the signal DIVO1). A zero-point is also created by the capacitor COUT because an equivalent serial resistor component actually exists in the capacitor COUT which is disposed for stabilizing an internal power supply voltage VDD.

From the facts as described above, the transfer function overall includes three poles and two zero-points. Therefore, an appropriate cancellation of two zero-points and two poles with each other makes it possible to make a characteristic of the overall transfer function close to the one including one pole. In order to make two zero-points and two poles cancel with each other appropriately, the relationship between the two poles must be controlled so as to prevent an occurrence of a large peak in an amplitude characteristic on the frequency axis. The amplifier circuit DFC and capacitor CM2 are disposed for the control. The capacitor CM1 functions as mirror capacitance, accomplishing a phase compensation with the pole of the output signal AMPO1 of the operational amplifier circuit AMP1 being a dominant pole.

For the phase compensation, the control is to limit the capacitance value CM1, which makes the Dole of the output signal AMPO1 as the dominant pole, to a minimum value of necessity, and, as for the relationship of the two high-order poles, the control is in a manner to not generate a large peak in the amplitude characteristic by using the capacitor CM2 and amplifier circuit DFC. This configuration prevents the two poles from widely separating from each other on the frequency axis, thereby enabling an improvement of a high speed response. As a result, a stability of the loop and a high speed response thereof are both obtained in a balance.

The second conventional example intends to obtain both a high speed response (i.e., traceability) and a stability of a feedback loop in a balance in the case of a fluctuation of a load current, by devising a method of phase compensation. However, there is a limit in a balanced obtainment of a high speed response and stability because the second conventional example also includes a capacitor COUT for stabilizing the internal power supply voltage VDD in the feedback loop. Consequently, a trial has been attempted to obtain the balance by fundamentally reexamining a circuit configuration.

FIG. 3 shows a configuration of a regulator circuit according to a third conventional example. The circuit is for obtaining both stability and a high speed response by fundamentally reexamining the circuit configuration shown in FIG. 3 of "Area-Efficient Linear Regulator With Ultra-Fast Load Regulation", authored by P. Hazucha, et al; IEEE Journal of Solid-State Circuits, vol. 40, No. 4, pp 933-940; April 2005 (noted as "non-patent document 2" hereinafter). In the showing of FIG. 3, an AMPF1 is a feedback control-use operational amplifier circuit, a Vset is an output signal of the operational amplifier circuit AMPF1, a Vref is a reference voltage applied to a non-inverting input terminal of the operational amplifier circuit AMPF1, an AMPLD1 is a load driving amplifier for generating an internal power supply voltage VDD, an AMPLD1R is a replica circuit (i.e., a replica amplifier) of the same configuration as the aforementioned load driving amplifier.

The load driving amplifier AMPLD1 comprises three PMOS transistors MP1, MPP1 and MPS and two N-channel MOF FETs (noted as "NMOS transistor" hereinafter) MN1 and MNB1. Respective sources of the PMOS transistors MP1 and MPP1 are applied by an external power supply voltage VCC, with the drain of the PMOS transistor MP1 being connected to the drain of the NMOS transistor MN1 and the gate of the PMOS transistor MPP1. A PPG1 is a signal input to the aforementioned gate. The source of the NMOS transistor MN1 is connected to the drain of the NMOS transistor MNB1, with the gate of the NMOS transistor MN1 being applied by the external power supply voltage VCC. The drain of the NMOS transistor MNB1 is additionally connected to the drain of the PMOS transistor MPS, and the source of the NMOS transistor MNB1 is connected to the ground GND. An NB1 is a signal input to the gate of the NMOS transistor MNB1. The source of the PMOS transistor MPS is connected to the drain of the PMOS transistor MPP1 and the capacitor COUT. The internal power supply voltage VDD is equivalent to the voltage across the terminals of the capacitor COUT.

For the replica amplifier AMPLD1R, which is the same configuration as the load driving amplifier AMPLD1, the elements constituting the former and the signals output from the elements are assigned by component signs which are added by "R" to the signs corresponding to the ones used for the load driving amplifier AMPLD1. For example, the MP1R is allocated as a sign to a PMOS transistor corresponding to the PMOS transistor MP1. As this defines the correlation, a detailed description is omitted. The inverting input terminal of the operational amplifier circuit AMPF1 is applied by a drain voltage VDDR (i.e., a replica internal power supply voltage VDD) of the PMOS transistor MPP1R, which is corresponded by the internal power supply voltage VDD. The output signal Vset of the operational amplifier circuit AMPF1 is input to the respective gates of the PMOS transistors MPS and MPSR.

The next is a specific description of an operation of the above described third conventional example.

In the third conventional example, the feedback circuit is constituted by the operational amplifier circuit AMPF1 and replica amplifier AMPLD1R. The feedback circuit functions so that a voltage value of a reference voltage Vref becomes identical with that of a drain voltage VDDR. For example, if the voltage value of the reference voltage Vref is 1.8 volts, that of the drain voltage VDDR becomes 1.8 volts.

If a voltage value of a drain voltage VDDR exceeds that of the reference voltage Vref, that of an output signal Vset of the operational amplifier circuit AMPF1 decreases, by which a current flowing between the source and drain of the PMOS transistor MPSR increases. Since a current flowing between the drain and source of the NMOS transistor MNB1R is of a constant volume determined by a signal NB1, however, a current flowing between the drain and source of the NMOS transistor MN1R decreases, which then causes a potential of the signal PPG1R to increase and therefore a current flowing between the source and drain of the PMOS transistor MPP1R decreases, lowering the drain voltage VDDR.

Contrarily, if a voltage value of the drain voltage VDDR becomes lower than that of the reference voltage Vref, a voltage value of an output signal Vset of the operational amplifier circuit AMPF1 increases, by which a current flowing between the source and drain of the PMOS transistor MPSR decreases. Since a current flowing between the drain and source of the NMOS transistor MNB1R is of a constant volume, however, a current flowing between the drain and source of the NMOS transistor MN1R increases, which then causes a potential of the signal PPG1R to decrease and therefore a current flowing between the source and drain of the PMOS transistor MPP1R increases, lifting the drain voltage VDDR.

The operation as described above is accomplished according to the relationship of magnitude of potentials between the drain voltage VDDR and reference voltage Vref, thereby being controlled so as to make these potentials identical. The replica amplifier AMPLD1R is configured the same as the load driving amplifier AMPLD1, and therefore the control results in maintaining the internal power supply voltage VDD at constant.

Note that characteristics of elements constituting the replica amplifier AMPLD1R may not necessarily be the same as those of elements constituting the load driving amplifier AMPLD1. For example, the current flowing in the load driving amplifier AMPLD1 may be controlled with designing the current of the replica amplifier AMPLD1R to be lower than that of the load driving amplifier AMPLD1.

Incidentally, although the internal power supply voltage VDD can be controlled to be completely identical with the drain voltage VDDR in the case of a load current not flowing, a load current according to an operation of an integrated circuit (i.e., a digital circuit) must be supplied. Accordingly, the next description is of an operation in the case of a load current flowing.

The load driving amplifier AMPLD1 increases a current flowing between the source and drain of the PMOS transistor MPP1 if a load current increases, while it decreases the current flowing between the source and drain thereof if the load current decreases. Therefore, the load driving amplifier AMPLD1 functions as feedback circuit. That is, the amplifier AMPLD1 comprises a feedback circuit for a load current.

As a load current increases, an internal power supply voltage VDD decreases. Since the reference voltage Vref is constant, a voltage between the gate and source of the PMOS transistor MPS decreases with the decrease of the internal power supply voltage VDD, and a current flowing between the drain and source thereof decreases. Since a current flowing between the drain and source of the NMOS transistor MNB1 is constant, a decrease of the current flowing between the drain and source of the PMOS transistor MPS causes a current flowing between the drain and source of the NMOS transistor MN1 to increase, which then decreases a potential of the signal PPG1, resulting in increasing a current flowing between the source and drain of the PMOS transistor MPP1.

Contrarily, if a load current decreases, an internal power supply voltage VDD increases. Since the reference voltage Vref is constant, a voltage between the gate and source of the PMOS transistor MPS increases with the increase of the internal power supply voltage VDD, the current flowing between the drain and source thereof increases. Since a current flowing between the drain and source of the NMOS transistor MNB1 is constant, the increase of the current flowing between the drain and source of the PMOS transistor MPS causes a current flowing between the drain and source of the NMOS transistor MN1 to decrease, which then increases a potential of the signal PPG1, resulting in decreasing a current flowing between the source and drain of the PMOS transistor MPP1.

As such, the load driving amplifier AMPLD1 comprises a feedback function for increasing or decreasing the current flowing between the source and drain of the PMOS transistor MPP1 in response to an increase or decrease of the load current. Due to this, even if a design is such as to make a drain voltage VDDR and an internal power supply voltage VDD identical in the case of a load current not flowing, a difference of potentials (noted as "potential difference" hereinafter) between the aforementioned two voltages is generated when a load current flows. Such a potential difference is determined by the magnitude of a load current and the amplification ratio of the load driving amplifier AMPLD1.

For the above described second conventional example, a gain of the feedback loop is determined by the product of the respective amplification ratios of the operational amplifier circuit AMP1, amplifier circuit AMP2 and PMOS transistor MPP1. This accordingly requires a design for a large gain so as to prevent a large fluctuation of a voltage value of the internal power supply voltage VDD caused by variations of temperature, external power supply voltage VCC, production process or load current.

Comparably, in the third conventional example, the feedback circuit for suppressing a change in a voltage value of an internal power supply voltage VDD is constituted by the operational amplifier circuit AMPF1 and replica amplifier AMPLD1R. Therefore, it is good enough if a gain calculated by the product of those amplification ratios is adequate. Therefore, it is possible to control so as to make the respective voltage values of a drain voltage VDDR and an internal power supply voltage VDD constant by setting a voltage value of an output signal Vset.

The function for controlling a voltage value of the internal power supply voltage VDD so as to be constant in the case of a load current fluctuating is comprised by only the load driving amplifier AMPLD1. Because of this, a gain required at the load driving amplifier AMPLD1 is adequate if it is capable of keeping a variation of the internal power supply voltage VDD within a desired range in response to a fluctuation of a load current. Therefore, it is adequate if a smaller gain than one required for the second conventional example is accomplished. A gain to be accomplished may be relatively small, with being able to suppress a variation of a voltage value of the internal power supply voltage VDD to a certain degree against a fluctuation of the load current. A capacitor COOT is connected to such a load driving amplifier AMPLD1. As a result of these, considering that a frequency in which a gain becomes 0 dB is constant, the load driving amplifier AMPLD1 is capable of easily accomplishing a wider band and a higher speed response by taking advantage of a small gain of the amplifier AMPLD1.

According to the aspects as described above, the third conventional example is configured to separate a feedback circuit responding to fluctuations of temperature, external power supply voltage VCC and production process from a feedback circuit responding to a fluctuation of a load current. By this, stability and a high speed response are balanced by accomplishing a high speed response more easily.

The third conventional example shown in FIG. 3 is configured in a manner to make potentials of an internal power supply voltage VDD and of a reference voltage Vref identical. This accordingly requires a reference voltage Vref of 1.8 volts in the case of controlling the internal power supply voltage VDD at 1.8 volts for example.

A reference voltage is commonly generated by using a bandgap circuit. FIGS. 4 and 5 show representative bandgap circuits. Such circuits are noted in "A CMOS Bandgap Reference Circuit with Sub-1-V Operation", authored by H. Banba, et al; IEEE Journal of Solid-State Circuits, vol. 34, No. 5, pp 670-674, May 1999 (noted as "non-patent document 3" hereinafter) Accordingly, a specific description at this point is on the representative bandgap circuit by referring to FIGS. 4 and 5.

The bandgap circuit is configured to add a potential of a forward-biased p-n junction and a voltage (i.e., PTAT voltage) which is Proportional To Absolute Temperature (PTAT), thereby obtaining a reference voltage independent of a temperature. A potential of a p-n junction is known as Complementary To Absolute Temperature (CTAT; a negative linear dependency to an absolute temperature T) if the potential is approximated by a linear expression, or within a range that such approximation by a linear expression is appropriate. Because of this, a reference voltage approximately independent of a temperature can be obtained by adding an appropriate PTAT voltage to a potential of a p-n junction.

FIG. 4 shows a configuration of a first bandgap circuit. In the showing of FIG. 4, a Q1 and Q2 are pnp bipolar transistor (noted as "pnp transistor" hereinafter), an R1 through R5 are resistors, an AMP3 and AMP4 are operational amplifier circuits, a GND is the ground, a Vbgr is a bandgap voltage, a Vref is a reference voltage, an IAM and IAP are internal nodes, a DIVO2 is an output signal of a voltage division circuit constituted by the resistors R4 and R5. An "x1" and "x10" attached to the pnp transistors Q1 and Q2, respectively, indicate a relative ratio of areas between them, that is, an area size of the transistor Q1 is one tenths of that of the transistor Q2.

The next description is of an operation thereof.

Using Vbe to express a voltage across the base and emitter of a bipolar transistor, or a forward voltage of a p-n junction, the relationship between the forward voltage and an absolute temperature T is known to be expressed by:

$$Vbe=Veg-a\cdot T \qquad (1);$$

where Veg is a bandgap voltage (i.e., approximately 1.2 volts) of silicon; and "a" is a coefficient expressing temperature dependence of a bandgap voltage Veg. The temperature dependence is known to be approximately 2 mV/° C. in a practical range although it is dependent on a bias current.

A rough relationship between an emitter current IE and a forward voltage Vbe of the bipolar transistor is known as follows:

$$IE=IOexp(q\cdot Vbe/k\cdot T) \qquad (2);$$

where IO is a constant proportional to area size, q is a charge of an electron, and k is the Boltzmann constant. If the gain is adequately large by a feedback of the operational amplifier circuit AMP3, the potentials of signals respectively input by way of the nodes IAN and IAP are (approximately) equal, thus stabilizing the circuit. In this event, if the ratio of resistance values of the resistors R1 to R2 is designed as one to ten (1:10) for example, the ratio of magnitudes of currents flowing in the pnp transistors Q1 to Q2 becomes ten to one (10:1). Therefore, the magnitudes of currents flowing in the transistors Q1 and Q2 are respectively expressed by 10xI and I for convenience here. Mentioned "x1" and "x10" in FIG. 4 shows the ratio of relative area between the transistors Q1 and Q2.

Where expressing Vbe1 and Vbe2 for voltages between the respective bases and emitters of the pnp transistors Q1 and Q2, a relationship is derived from the expression (2), as follows:

$$10xI=IOexp(q\cdot Vbe1/k\cdot T) \qquad (3)$$

$$I=10\cdot IOexp(q\cdot Vbe2/k\cdot T) \qquad (4)$$

Summarizing the expressions by a division on either side, respectively, obtains the following expression (5), and summarizing by expressing Vbe1−Vbe2=ΔVbe obtains the following expression (6):

$$100=exp(q\cdot Vbe1/k\cdot T-q\cdot Vbe2/k\cdot T) \qquad (5)$$

$$\Delta Vbe=(k\cdot T/q)\ln(100) \qquad (6)$$

As apparent from the expression (6), the ΔVbe, i.e., the difference of voltages between the respective bases and emitters of the pnp transistors Q1 and Q2, is expressed by a natural logarithm (=ln (100)) of a current density ratio (=100) of the transistors Q1 and Q2 and a thermal voltage (k·T/q). Because the voltage difference ΔVbe is equal to a potential difference between both of the terminals of the resistor R3, a current of ΔVbe/R3 flows in the resistors R2 and R3. Therefore, a potential difference VR2 between both of the terminals of the resistor R2 is expressed as follows:

$$VR2=\Delta Vbe\cdot R2/R3 \qquad (7)$$

The respective potentials of the nodes IAP and IAM are equal to the voltage Vbe1, and therefore a bandgap voltage Vbgr is represented by the following expression:

$$Vbgr=Vbe1+\Delta Vbe\cdot R2/R3 \qquad (8)$$

The forward voltage Vbe1 has a negative temperature dependence decreasing with temperature increase (refer to the expression (1)) and the voltage difference ΔVbe increases proportionately with temperature as shown by the expression (6) Because of this, it is possible to design so that a voltage value of a bandgap voltage Vbgr is independent of a temperature by selecting a constant appropriately. The voltage value results in approximately 1.2 volts which is equivalent to the bandgap voltage of silicon.

The reference voltage Vref of 1.8 volts can be generated by setting the bandgap voltage Vbgr 1.5 times thereof. Setting the resistance ratio of R4 to R5 constituting the voltage division circuit at one to two (1:2), the potential of a reference voltage Vref is determined so as to equalize the potentials of an output signal DIVO2 and of a bandgap voltage Vbgr, thereby making it possible to generate the reference voltage Vref of 1.8 volts. The third conventional example shown in FIG. 3 generates an internal power supply voltage VDD of 1.8 volts by applying such a reference voltage Vref to the non-inverting input terminal of the operational amplifier circuit AMPF1.

In the case of making the operational amplifier circuit AMP4 perform an arithmetic operation of magnifying a bandgap voltage Vbgr 1.5 times, in practice, a voltage error caused by an offset of the operational amplifier circuit AMP4 influences on a voltage accuracy of a reference voltage Vref in addition to generation accuracy of the bandgap voltage Vbgr. That is, the reference voltage Vref contains an error caused by a circuit part for generating the reference voltage Vref from the bandgap voltage Vbgr, and the error consequently degrades voltage accuracy of an internal power supply voltage VDD. That is, a combination of the conventional circuit shown in FIG. 3 with a bandgap circuit such as the one shown in FIG. 4 is faced with a problem of an error caused by the operational amplifier circuit AMP4 shown in FIG. 4 being added to the reference voltage Vref.

FIG. 5 shows a configuration of a second bandgap circuit which is a circuit called as a bandgap circuit of an electric current mode and is capable of generating a discretionary reference voltage Vref, unlike the one shown in FIG. 4. In the showing of FIG. 5, an AMP5 is an operational amplifier circuit, an AMPO5 is an output signal of the operational amplifier circuit AMP5, an R6 through R8 are resistors, an MP2 through MP4 are PMOS transistors, and an IAM and IAP are internal nodes. The other signs are the same as in the case of FIG. 4.

The next description is of an operation thereof.

The bandgap circuit shown in FIG. 5 stabilizes potentials of the nodes IAM and IAP by being (approximately) equal to each other by a feedback of the operational amplifier circuit AMP5 in the same manner as the one shown in FIG. 4. Here, the assumption is that the sizes of the PMOS transistors MP2 and MP3 are the same, that is, currents of the same magnitude flow in them for simplicity of description. Also, likewise FIG. 4, an emitter area size of the pnp transistor Q2 is ten times that of the pnp transistor Q1. Also, voltages between the respective bases and emitters of the pnp transistors Q1 and Q2 are indicated by Vbe1 and Vbe2, respectively.

From the expression (2), there are apparently relationships in the bandgap circuit as follows:

$$I = I0 \exp(q \cdot Vbe1/k \cdot T) \quad (9)$$

$$I = 10 \cdot I0 \exp(q \cdot Vbe2/k \cdot T) \quad (10)$$

Summarizing the expressions by dividing on either side obtains the expression (11), followed by summarizing it by expressing Vbe1−Vbe2=ΔVbe, thus obtaining the expression (12):

$$10 = \exp(q \cdot Vbe1/k \cdot T - q \cdot Vbe2/k \cdot T) \quad (11)$$

$$\Delta Vbe = (k \cdot T/q) \ln(10) \quad (12)$$

As apparent from the expression (12), the difference ΔVbe of voltages between the respective bases and emitters of the pnp transistors Q1 and Q2 is expressed by a natural logarithm (=ln(10)) of an electric current density ratio (=10) of the transistors Q1 and Q2 and a thermal voltage (k·T/g). Because the voltage difference ΔVbe is equal to a potential difference between both of the terminals of the resistor R3, a current of ΔVbe/R3 flows in the resistor R3. Therefore, a current IR3 flowing in the resistor R3 is expressed as follows:

$$IR3 = \Delta Vbe/R3 \quad (13)$$

The respective potential of the nodes IAP and IAM are equal to the Vbe1, and therefore resistors of the same resistance value are selected for the resistors R6 and R7. Assuming the resistance value as R67, and the current flowing in the individual resistors as IR67, the current IR67 is expressed as follows:

$$IR67 = Vbe1/R67 \quad (14)$$

Since the sizes of the PMOS transistors MP2 and MP3 are assumed to be the same for simplicity of description herein, the currents flowing in individual transistors MP2 and MP3 are sum of the currents calculated by the expressions (13) and (14) respectively. Therefore, the current, defined as IMP23, is represented by the following expressions:

$$IMP23 = \Delta Vbe/R3 + Vbe1/R67 \quad (15)$$

The forward voltage Vbe1 has negative temperature dependence that decreases with temperature increase (refer to the expression (1)), and the voltage difference ΔVbe increases proportionally with temperature as shown by the expression (12). Therefore, an appropriate selection of a constant enables a design so as to make a current value of the current IMP23 flowing in the PMOS transistors MP2 and MP3 become independent of a temperature. A reference voltage Vref independent of a temperature can be generated by having the same current equivalent to the current IMP23 in the resistor R8. Assuming that all the sizes of the PMOS transistors MP2 through MP4 are the same, with the same magnitude of current flowing in them, the reference voltage Vref is represented by the following expression:

$$Vref = (\Delta Vbe/R3 + Vbe1/R67) \cdot R8 \quad (16)$$

As apparent from the expression (16), a voltage value of the reference voltage Vref can be discretionarily selected by a resistance value of the resistor R8. Therefore, it is possible to generate a reference voltage Vref of a discretionary voltage value directly without using an operational amplifier circuit.

For the bandgap circuit shown in FIG. 4, a ratio of currents flowing in the pop transistors Q1 to Q2 is designed by a ratio of resistance of the resistors R1 to R2. Comparably, for the bandgap circuit shown in FIG. 5, the ratio of currents is designed by an area size ratio of the PMOS transistors MP2 to MP3, and also a value of the current flowing in the resistor R8 is designed by an area size ratio of the PMOS transistor MP4 to PMOS transistor MP2 (or MP3). This causes a voltage error of the reference voltage Vref to increase by a mismatch among the PMOS transistors MP2, MP3 and MP4. That is, a case of combining the conventional circuit shown in FIG. 3 with a bandgap circuit as shown in FIG. 5 is also faced with the problem of adding an error caused by a mismatch among the PMOS transistors MP2, MP3 and MP4 to a reference voltage. Comparing accuracy of matching resistors with that of matching MOS transistors, the former is generally expected to be better. This is because a resistance value is determined by its dimensions and impurity concentration or dose of a resistor, whereas other parameters to be controlled exist, such as an oxide film thickness, in addition to a form and a concentration of impurities of a channel for the MOS transistors. Because of this, the voltage accuracy of a reference voltage Vref is generally higher with the bandgap circuit shown in FIG. 4.

As described above, an error is included in a reference voltage Vref generated by a bandgap circuit. The error degrades voltage accuracy of an internal power supply voltage VDD. Accordingly conceivable is to avoid an influence of the error by using a bandgap voltage Vbgr directly.

FIG. 6 shows a configuration of a regulator circuit according to a modified example of the third conventional example. The modified example is configured to supply a non-inverting input terminal of the operational amplifier circuit AMPF1 with a bandgap voltage Vbgr as a reference voltage. Resistors RF1R and RF2R are connected between the drain of a PMOS transistor MPP1R and ground GND. The inverting input terminal of the operational amplifier circuit AMPF1 is connected to the other terminal of the resistor RF1R. By this, the inverting input terminal is input by an output signal DIVO1R of a voltage division circuit which is constituted by the resistors RF1R and RF2R.

The third conventional example shown in FIG. 3 is configured to generate an internal power supply voltage VDD of 1.8 volts. Therefore, a drain voltage VDDR is usually 1.8 volts. A bandgap voltage is 1.2 volts. Because of this, the resistance ratio of the resistors RF1R and RF2R constituting the above described voltage division circuit is designed as RF1R:RF2R=1:2. By this, the voltage division circuit divides the drain voltage VDDR and outputs an output signal DIVO1R of 1.2 volts. Since such an output signal DIVO1R is supplied to the inverting input terminal of the operational amplifier circuit AMPF1, a bandgap voltage Vbgr of 1.2 volts can be used as is.

The third conventional example shown in FIG. 3 and the modified example thereof shown in FIG. 6 comprise only one load driving amplifier AMPLD1. There is, however, a case in which a plurality of such amplifiers AMPLD1 is desired to be furnished. The reason is that there is a case of dividing an integrated circuit on a semiconductor chip into a circuit part, such as a register and memory, which is to be supplied with a power supply voltage at all times, and a circuit part from which the power supply voltage is shut off except at the time of an operation. In such a case, the same number of load driving amplifiers as the number of divided circuit parts is usually furnished.

In the case of furnishing a plurality of power supply circuits such as the load driving amplifier AMPLD1, the power supply circuits are desirably to be placed close to circuits (i.e., digital circuits) constituting loads from a view point of minimizing an internal power supply line length. As a result, the third conventional example shown in FIG. 3 (and the modified example thereof shown in FIG. 6) places the load driving amplifier AMPLD1 and replica amplifier AMPLD1R apart from each other in many cases.

The third conventional example requires characteristics of the PMOS transistors MPS and MPSR to be identical to each other highly accurately in order to generate an internal power supply voltage VDD in high accuracy. As widely known, a characteristic of element produced onto a semiconductor chip by the production process is affected by a position on the semiconductor chip and a layout of the surrounding area. Therefore, a physical closeness is very important in order to make the characteristics of the elements identical in high accuracy. Consequently, if the load driving amplifier AMPLD1 and replica amplifier AMPLD1R are placed far apart from each other, it becomes difficult to make the characteristics of the PMOS transistors MPS and MPSR identical in high accuracy.

Consequently, an internal power supply voltage VDD cannot always be securely generated in high accuracy even if the bandgap voltage Vbgr is used as a reference voltage as in the modified example shown by FIG. 6. Accordingly, having been required is a capability of generating an internal power supply voltage VDD securely in high accuracy. Also required strongly is a capability of generating such an internal power supply voltage by a simpler configuration. That is, there has been a problem of an error caused by a mismatch of the PMOS transistors MPS and MPSR being added to a generated power supply voltage if the physical distance between the PMOS transistors MPS and MPSR becomes large even in the case of adopting a circuit as shown in FIG. 6.

The reference technical documents include U.S. Pat. Nos. 6,285,246; 6,300,749; 6,388,433; 6,847,260; 6,175,223; Laid-Open Japanese Patent Application Publication Nos. 08-272461, 2005-202781, 2004-152891, 2002-157031, Japanese Translation of PCT International Application Publication No. 2004-504660, and Laid-Open Japanese Patent Application Publication No. 2005-276190.

SUMMARY OF THE INVENTION

A first purpose of the present invention is to provide a regulator circuit solving the above described problems and being capable of accomplishing a generation of an internal power supply voltage in stability, high speed response and firmly high accuracy.

A second purpose of the present invention is to provide a regulator circuit accomplishing a generation of an internal power supply voltage in stability, high speed response and firmly high accuracy by a simpler configuration.

A regulator circuit according to a first aspect of the present invention, premising a configuration of a plurality of amplifier circuit, comprises a load driving amplifier for supplying a load current by generating a predetermined constant power supply voltage, a replica amplifier comprising fundamentally the same as the load driving amplifier and an operational amplifier for forming a feedback circuit in association with the replica amplifier, as the plurality of amplifier circuits, the load driving amplifier and the replica amplifier comprises a differential pair constituted by a first transistor for receiving an input of a first signal output from the operational amplifier and by a second transistor receiving an input of a third signal generated by dividing a voltage of a second signal of the power supply voltage by a resistance voltage division circuit, and the operational amplifier generates and outputs, the first signal according to a difference of a potential between a fourth signal used as a reference and the third signal output from the replica amplifier.

A regulator circuit according to a second aspect of the present invention, premising a configuration of at least one amplifier circuit, comprises a load driving amplifier, comprising a differential pair constituted by a first transistor receiving an input of a first signal used as a reference and by a second transistor receiving an input of a third signal generated by outputting a second signal of a predetermined constant power supply voltage, for supplying a load current; and a resistance voltage division circuit for generating the third signal from the second signal.

A regulator circuit according to a third aspect of the present invention further comprises a charging-use amplifier for charging a capacitance element connected to the load driving amplifier for stabilizing the second signal, in addition to the configuration for the above noted first or second aspect.

A regulator circuit according to a fourth aspect of the present invention further comprises an output stopping unit for stopping an output of the second signal from the load driving amplifier during a period in which the charging-use amplifier charges the capacitance element, in addition to a configuration for the above noted either of first aspect through third aspect. The charging-use amplifier preferably comprises an electric current control unit for controlling an electric current flowing in the second transistor, in addition to fundamentally the same configuration as the load driving amplifier. The electric current control unit preferably suppresses an increase of an electric current flowing in the second transistor with voltage applied thereto.

A regulator circuit according to a fifth aspect of the present invention further comprises a discharge unit for responding to an over-charging in the capacitance element by making the capacitance element discharge a charged charge therein after completing a charging by the charging-use amplifier, in addition to a configuration for the above noted either of first aspect through fourth aspect.

The present invention is contrived to adopt a differential pair type amplifier circuit comprising a differential pair constituted by a first transistor receiving an input of a first signal and by a second transistor receiving an input of a third signal generated by outputting a second signal of which the voltage level is a power supply voltage.

An amplifier circuit is usually placed close to a circuit block to be supplied by an electric current. Because of this, amplifier circuits cannot be actually placed within a narrow area in many cases for a regulator circuit comprising a plurality of the amplifier circuits. However, elements requiring a matching are transistors constituting the differential pair in the same amplifier circuit for the above noted differential pair type amplifier circuit. Because of this, the elements requiring a matching can be placed close to each other regardless of a layout between the amplifier circuits. This results in the characteristics being always identical in high accuracy. Therefore, a power supply voltage can be firmly generated in high accuracy.

A band gap voltage can be generated in high accuracy. Because of this, it is possible to suppress an error caused by the first signal to a minimum in the case of adopting the first signal for which the voltage level is the bandgap voltage.

In the case of further preparing a charging-use amplifier circuit for charging a capacitance element connected to a supply-use amplifier circuit for stabilizing the second signal, the charging of the capacitance element can be carried out more adequately, thereby making it possible to generate a more stable power supply voltage. In the case of adopting a configuration of adding an electric current control unit for controlling a current flowing in the second transistor in addition to fundamentally the same configuration as the supply-use amplifier circuit as the charging-use amplifier circuit, it is possible to respond to a fluctuation of a potential of an external power supply voltage more adequately.

A charging by a charging-use amplifier circuit cannot always be carried out adequately. An over-charging may occur. The furnishing of a discharge unit for discharging a charge which is charged in a capacitance element after completing the charging by the charging-use amplifier circuit makes it possible to respond an over-charging more appropriately and quickly.

A resistor can be produced in higher accuracy as compared to a MOS FET, et cetera. Because of this, in the case of generating the third signal from the second signal by the voltage division circuit constituted by resistors, a potential of the second signal can be divided in high accuracy.

All the configurations as described above improve accuracy of generating a signal. Therefore, it is also possible to accomplish a generation of an (internal) power supply voltage firmly in high accuracy in addition to stability and a high speed response.

In the case of operating an amplification-use transistor comprised by the above described amplifier circuit in a saturation region, a practically adequate gain is obtained. Because of this, one except for a supply-use amplifier circuit from among the supply-use amplifier circuit, replica amplifier circuit and feedback-use amplifier circuit can be eliminated in such a case, while satisfactorily generating a power supply voltage in stability, high speed response and firmly high accuracy. A removal of one or more from among these circuits further enables a simplification of a circuit configuration and a suppression of production costs.

BRIEF DESCRIPTION OF THE DRAWINGS

FIG. 8 shows a circuit configuration of a first modified example according to the first embodiment;

FIG. 10 shows a circuit configuration of a third modified example according to the first embodiment;

FIG. 14 shows an example configuration of an operational amplifier circuit AMPF1;

FIG. 15 shows a configuration of a regulator circuit according to a second embodiment;

FIG. 18A through 18D are graphs describing signals being transmitted in circuits shown in FIGS. 15 through 17, or operation waveform examples of nodes (part 1);

DESCRIPTION OF THE PREFERRED EMBODIMENTS

The following is a detailed description of the preferred embodiment of the present invention by referring to the accompanying drawings.

Figure 7:
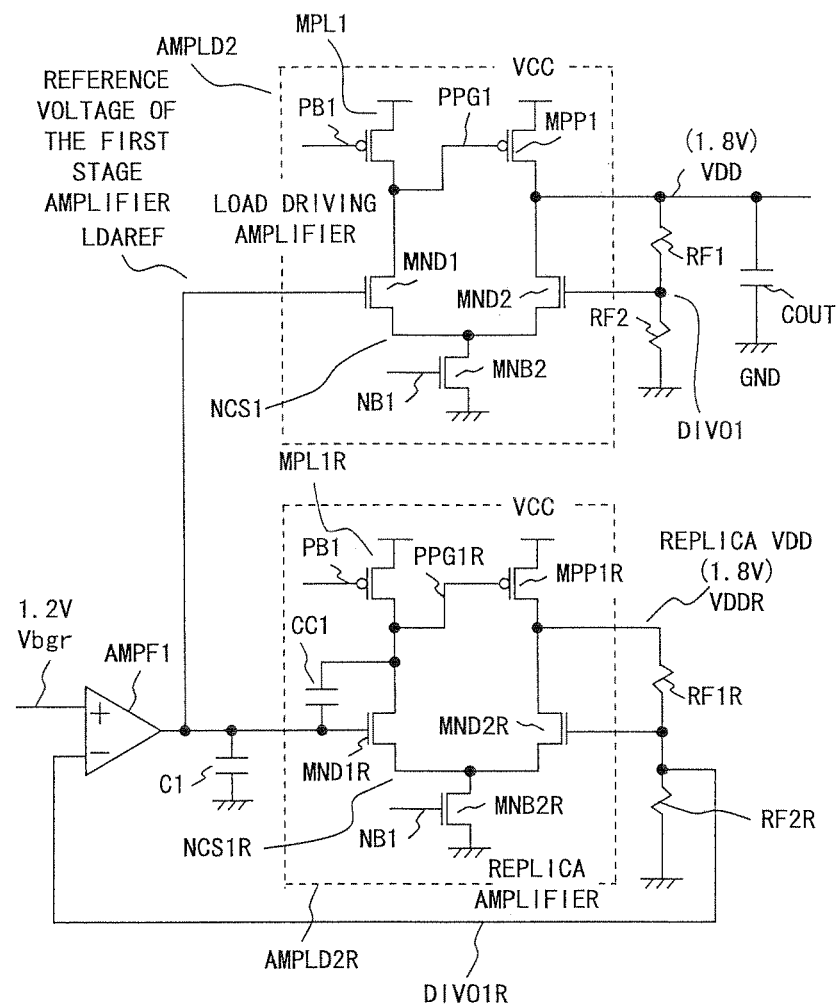
FIG. 7 shows a configuration of a regulator circuit according to a first embodiment.

FIG. 7 shows a configuration of a regulator circuit according to a first embodiment. In the showing of FIG. 7, an AMPF1 is a feedback control-use operational amplifier circuit; an LDAREF is an output signal of the operational amplifier circuit AMPF1; a Vbgr is a bandgap voltage applied to a non-inverting input terminal of the operational amplifier circuit AMPF1; a C1, COUT and CC1 are capacitors; an RF1, RF2, RF1R and RF2R are resistors; a DIVO1R is an output signal from a voltage division circuit constituted by the resistors RF1R and RF2R; an AMPLD2 is a load driving amplifier for generating an internal power supply voltage VDD; an AMPLD2R is a replica circuit (i.e., a replica amplifier) of which the configuration is the same as the load driving amplifier.

The load driving amplifier AMPLD2 comprises two PMOS transistors MPL1 and MPP1, and three NMOS transistors MND1, MND2 and MNB2. The respective sources of the PMOS transistors MPL1 and MPP1 are applied by an external power supply voltage VCC, the drain of the PMOS transistor MPL1 is connected to the drain of the NMOS transistor MND1 and the gate of the PMOS transistor MPP1. A PPG1 is a signal input to the gate.

The source of the NMOS transistor MND1 is connected to the drain of the NMOS transistor MNB2, and an output signal LDAREF is input to the gate of the NMOS transistor MND1. The source thereof is connected to the ground GND.

The source of the NMOS transistor MND1 is connected to that of the NMOS transistor MND2, the NMOS transistors MND1 and MND2 constitute a differential circuit, and the NMOS transistor MNB2 functions as tail current source for the differential circuit. That is, the total current of currents flowing in the NMOS transistors MND1 and MND2, respectively, is maintained constantly at the same amount as the current flowing in the NMOS transistor MNB2. The output signal LDAREF is input to the gate of the NMOS transistor MND1. The source of the NMOS transistor MNB2 is connected to the ground GND.

The drain of the NMOS transistor MND2 is connected to the drain of the PMOS transistor MPP1, the resistor RF1 and the capacitor COUT. A voltage at the drain is an internal power supply voltage VDD. The source and gate of the NMOS transistor MND2 are respectively connected to the drain of the NMOS transistor MNB2 and the other terminal of the resistor RF1. The voltage division circuit constituted by the resistors RF1 and RF2, and the capacitor COUT, connect between the drain of the PMOS transistor MPP1 and the ground GND. By this, a voltage value of an output signal DIVO1 input to the gate of the NMOS transistor MND2 from the voltage division circuit is a voltage dividing the internal power supply voltage VDD by a resistance ratio of the resistors RF1 to RF2. Therefore, assuming a bandgap voltage Vbgr at 1.2 volts, and an internal power supply voltage VDD at 1.8 volts, the resistance ratio is RF1:RF2=1:2. Incidentally, an NCS1 indicates an internal node.

The replica amplifier AMPLD2R is configured fundamentally the same as the load driving amplifier AMPLD2. Component signs of elements comprising the replica amplifier AMPLD2R and of signals output from the elements are attached by "R" at the end of the signs corresponding to the load driving amplifier AMPLD2. For example, MPL1R is attached as component sign to the PMOS transistor corresponding to the PMOS transistor MPL1. Since the correlation is made apparent as such, a detailed description is omitted here.

For the replica amplifier AMPLD2R, a capacitor CC1 connects between the gate and drain of the NMOS transistor MND1R. The capacitor CC1 functions as phase compensation capacitance. The capacitor C1 connecting between the output terminal of the operational amplifier circuit AMPF1 and the ground GND functions as stabilization capacitance for the output signal LDAREF.

A voltage division circuit constituted by the serially connected resistors RF1R and RF2R connects between the drain of the PMOS transistor MPP1R and the ground GND as in the case of the load driving amplifier AMPLD2. By this, inputted to the gate of the NMOS transistor MND2R and the inverting input terminal of the operational amplifier circuit AMPF1 is an output signal DIVO1R obtained by dividing the drain voltage VDDR by the resistance ratio of the resistors RF1R to RF2R.

The next description is of an operation thereof. In this event, the assumption is that 1.2 volts for a voltage value of the bandgap voltage Vbgr, and 1.8 volts for the internal power supply voltage VDD (i.e., the drain voltage VDDR). In this assumption, the resistance ratio of the resistors RF1R to RF2R divides the drain voltage VDDR of 1.8 volts, thereby outputting an output signal DIVO1R of 1.2 volts.

The first is a specific description of an operation of the feedback circuit constituted by the replica amplifier AMPLD2R and operational amplifier circuit AMPF1. As a voltage value of the output signal DIVO1R exceeds that of the bandgap voltage Vbgr, a voltage value of the output signal LDAREF of the operational amplifier circuit AMPF1 decreases. The decrease of the voltage value decreases a current flowing in the NMOS transistor MND1R. The NMOS transistors MND1R and MND2R together constitute a differential circuit, and the NMOS transistor MNB2R functions as tail current source for the differential circuit. A current flowing in the NMOS transistor MNB2R is of a constant volume determined by a signal NB1. A reduction of the current flowing in the NMOS transistor MND1R makes a potential of the signal PPG1R increase. Consequently, the current flowing in the PMOS transistor MPP1R decreases and a potential of the drain voltage VDDR decreases. The decrease of the potential of the drain voltage VDDR reduces a potential of the output signal DIVO1R, that is, changes in the direction of equaling to the potential of the bandgap voltage Vbgr.

Contrarily, as the voltage value of the output signal DIVO1R becomes less than that of the bandgap voltage Vbgr, a voltage value of the output signal LDAREF of the operational amplifier circuit AMPF1 increases. The increase of the voltage value increases a current flowing in the NMOS transistor MND1R. The increase of the current decreases a potential of the signal PPG1R, thereby increasing a current flowing in the PMOS transistor MPP1R. Accordingly, a potential of the drain voltage VDDR increases and that of the output signal DIVO1R also increases, that is, changes towards equivalence to a potential the bandgap voltage Vbgr.

Based on what has been described above, a size of the PMOS transistor MPL1R and a potential of a signal PB1 input to the gate thereof are designed so that a potential of the output signal PPG1R is changed by a current flowing in the NMOS transistor MND1R. If the design is such as to make a current flowing in the PMOS transistor MPL1R greater than that flowing in the NMOS transistor MNB2R, a potential of the signal PPG1R does not decrease even though a current flowing in the PMOS transistor MPL1R increases. A design not causing such an undesirable operation is necessary. Such an undesirable operation can be avoided by designing a current flowing in the PMOS transistor MPL1R to be about one half of that flowing in the NMOS transistor MNB2R.

The operation as described above makes the bandgap voltage Vbgr eventually equal to a potential of the voltage DIVO1R obtained by dividing the drain voltage VDDR. Also, a potential of the output signal LDAREF is determined so that the potential of the bandgap voltage Vbgr is equal to that of the voltage DIVO1R obtained by dividing the drain voltage VDDR. Even if a power supply voltage VCC, temperature, process condition, et cetera change, the same is true in that the bandgap voltage Vbgr and the voltage DIVO1R obtained by dividing the drain voltage VDDR become equal by the feedback circuit described above and the potential of the output signal LDAREF is so determined as to make the potential of the bandgap voltage Vbgr equal to that of the voltage DIVO1R obtained by dividing the drain voltage VDDR. Since the potential of the bandgap voltage Vbgr is equal to that of the voltage DIVO1R obtained by dividing the drain voltage VDDR, the appropriate designs of a resistance ratio of the resistors RF1 to RF2 and that of the resistors RF1R to RF2R make it possible to design the potential of the drain voltage VDDR to be a desired voltage. For example, it is possible to obtain the drain voltage of 1.8 volts from the potential Vbgr of 1.2 volts by designing to make a potential of the drain voltage VDDR at 1.5 times that of the voltage DIVO1R.

The next is a specific description of an operation of the load driving amplifier AMPLD2. The assumption here is that the individual amplifiers AMPLD2 and AMPLD2R comprises elements of the same characteristics for simplicity of description. Accordingly, a resistance ratio of the resistors RF1 to RF2 is assumed to be the same as that of the resistors RF1R to RF2R. Also assumed is not to consider a mismatch among elements. Note that characteristics of elements constituting the replica amplifier AMPLD2R may be chosen to be smaller than those of elements constituting the load driving amplifier AMPLD2, thereby making a current flowing in the replica amplifier AMPLD2R further smaller.

In the case of sizes of respective elements constituting the individual amplifiers AMPLD2 and AMPLD2R being the same, a current flowing in the load driving amplifier AMPLD2 becomes the same as that flowing in the replica amplifier AMPLD2R; it is, however, apparently possible to design a current of the replica amplifier AMPLD2R to be one tenths ($1/10$) of that of the load driving amplifier AMPLD2 if an element size of the replica amplifier AMPLD2R is designed to be $1/10$ of that of the load driving amplifier AMPLD2. As such, a benefit of a low consumption power is obtained if a current flowing in the replica amplifier AMPLD2R is designed to be small.

According to the above noted assumption, a potential of a drain voltage VDDR becomes equal to that of the internal power supply voltage VDD. If currents flowing in the PMOS transistors MPP1 and MPP1R are the same, the potential of a drain voltage VDDR and that of an internal power supply voltage VDD become completely identical.

In the case of a load current not flowing, the potentials of the internal power supply voltage VDD and drain voltage VDDR are completely identical, the load driving amplifier AMPLD2, however, must supply a load current according to an operation of a target circuit. Accordingly, the next is a specific description on an operation in the case of a load current flowing.

When a load current supplied by an the internal power supply voltage VDD increases, the power supply voltage VDD per se decreases, with which a potential of an output signal DIVO1 decreases, and therefore a current flowing in the NMOS transistor MND2 decreases. Since a current flowing in the NMOS transistor MNB2 (i.e., between the drain and source thereof) is constant according to a signal NB1, the aforementioned decrease causes a current flowing in the NMOS transistor MND1 (i.e., between the drain and source thereof) to increase. The increase causes a potential of a signal PPG1 to decrease, thereby increasing a current flowing in the PMOS transistor MPP1 (i.e., between the source and drain thereof).

Contrarily, when a load current decreases, an internal power supply voltage VDD increases. The increase causes a potential of the output signal DIVO1 to increase and a current flowing in the NMOS transistor MND2 (i.e., between the drain and source thereof) to increase. Since a current flowing in the NMOS transistor MNB2 (i.e., between the drain and source thereof) is constant, the increase of the current makes a current flowing in the NMOS transistor MND1 (i.e., between the drain and source thereof) decrease. The decrease causes a potential of the signal PPG1 to increase, resulting in decreasing a current flowing in the PMOS transistor MPP1 (i.e., between the source and drain thereof).

As described above, the load driving amplifier AMPLD2 comprises a feedback function for increasing or decreasing a current flowing in the PMOS transistor MPP1 according to an increase or decrease of a load current. Because of this, even though a design is such as to make a drain voltage VDDR and an internal power supply voltage VDD equal to each other in the case of a load current not flowing, a potential difference between them is generated when a load current flows. The potential difference is determined by a magnitude of the load current and an amplification ratio of the load driving amplifier AMPLD2.

Figure 1:
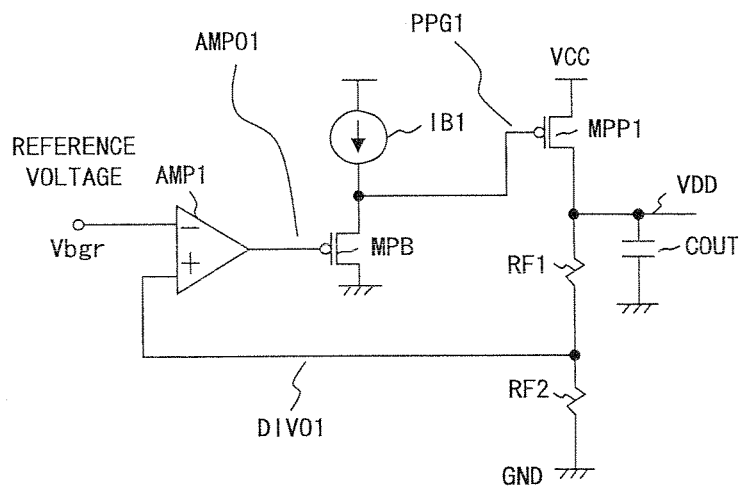
FIG. 1 shows a configuration of a regulator circuit according to a first conventional example.
Figure 2:
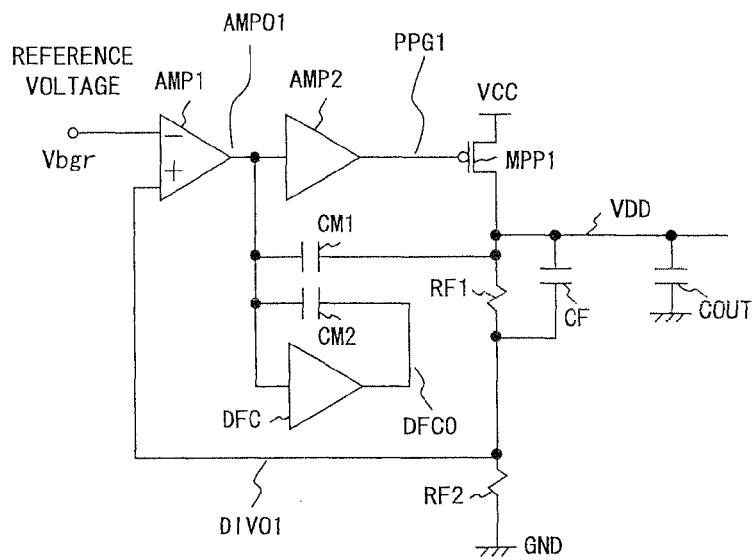
FIG. 2 shows a configuration of a regulator circuit according to a second conventional example.

For the conventional circuit shown in FIG. 2, a gain of a loop is determined by the product of respective amplification ratios of the operational amplifier circuit AMP1, amplifier circuit AMP2, PMOS transistor MPP1; and because of this, the design has been carried out to obtain a large gain of the loop for avoiding a large change in a voltage value of the internal power supply voltage VDD even if there are variations such as a temperature, power supply voltage VCC, process or load current.

Comparably, for the circuit according the present invention (i.e., the first embodiment) shown in FIG. 7, the loop constituted by the operational amplifier circuit AMPF1 and replica amplifier AMPLD2R is the control loop for suppressing a variation of a potential of the internal power supply voltage VDD (that is, the drain voltage VDDR) caused by fluctuations such as a power supply voltage VCC, temperature and process, and therefore it is enough if there is an adequate gain of the operational amplifier circuit AMPF1 and replica amplifier AMPLD2R. Therefore, it is possible to control so as to make the respective values of voltages VDDR and VDD constant by setting a potential of the output signal LDAREF. In the circuit shown in FIG. 7, the load driving amplifier AMPLD2 is the only one taking a role of controlling a potential of each part so as to keep a value of the internal power supply voltage VDD constant in the case of a load current fluctuating, and therefore it is acceptable if the load driving amplifier AMPLD2 accomplishes a gain so that a variation of the internal power supply voltage VDD is controlled within a desired range responding to a fluctuation of the load current. That is, the load driving amplifier AMPLD2 per se does not need a large gain such as the loop gain of the conventional circuit shown in FIG. 2. A voltage gain of the load driving amplifier AMPLD2 can be a small value with capability of suppressing a variation in a potential of the internal power supply voltage VDD against a load current fluctuation to some extent, and therefore, considering a frequency at which a gain is 0 dB is constant for example, the load driving amplifier AMPLD2 is operable in a wide band and is capable of a high speed response, taking advantage of the small gain.

For the conventional circuit shown in FIG. 2, there has been a necessity for the single loop constituted by the operational amplifier circuit AMP1, amplifier circuit AMP2 and PMOS transistor MPP1 to respond to fluctuation such as a temperature, power supply voltage VCC, process and load current, thus requiring a large gain by the loop.

Comparably, for the circuit (i.e., the first embodiment) shown in FIG. 7, the loop constituted by the operational amplifier circuit AMPF1 and replica amplifier AMPLD2R responds to fluctuations such as a temperature, power supply voltage VCC and process, and therefore needs a large loop gain for the aforementioned part; the feedback loop within the load driving amplifier AMPLD2, however, only responds to a load current variation and it is enough to be capable of responding only to the load current variation, hence eliminating a necessity of excessively increasing a loop gain of the load driving amplifier AMPLD2 per se. Therefore, a small loop gain of the load driving amplifier AMPLD2 makes it possible to widen a band thereof, achieving a high speed response in the case of a load current fluctuating. Meanwhile, for the conventional circuit shown in FIG. 2, there has been the problem of a fundamental difficulty in designing a tradeoff between an accomplishment of a large loop gain and a high speed drive of a capacitance COUT because a signal path of the amplification stages, i.e., AMP1, AMP2 and MPP1, for accomplishing a large loop gain includes the capacitance COUT for stabilizing the internal power supply voltage VDD. Whereas for the circuit shown in FIG. 7, such a capacitance COUT is not included in the path of the loop constituted by the operational amplifier circuit AMPF1 and replica amplifier AMPLD2R which must have a large loop gain for responding to fluctuations of a temperature, power supply voltage VCC and process. The capacitance COUT is within a signal path of the load driving amplifier AMPLD2 of the loop with a relatively small gain, responding to a load current fluctuation, and therefore the loop constituted by the operational amplifier circuit AMPF1 and replica amplifier AMPLD2R is easier to respond in high speed as compared to the conventional circuit shown in FIG. 2 (i.e., a capacitance COUT is not included).

A loop gain of the load driving amplifier AMPLD2 including the capacitance COUT is smaller than that of the circuit shown in FIG. 2, and therefore a loop of the load driving amplifier AMPLD2 per se can also be easily responsive in high speed as compared to the circuit shown in FIG. 2.

After all, a division of the circuit (i.e., the first embodiment) shown in FIG. 7 into a loop responding to variations of a temperature, power supply voltage VCC and process and a loop responding to only a load current variation accomplishes a high speed response as compared to the conventional circuit shown in FIG. 2.

Figure 3:
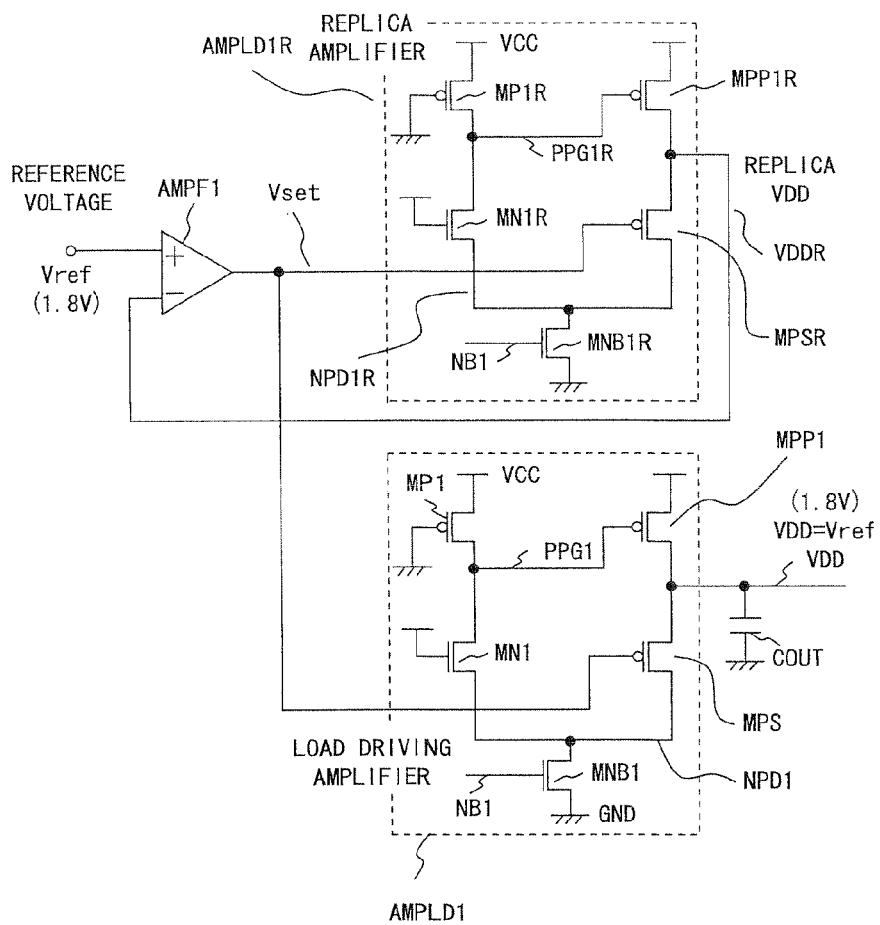
FIG. 3 shows a configuration of a regulator circuit according to a third conventional example.

As described above, the circuit according to the present invention shown in FIG. 7 is configured to have a similar control loop to that of the conventional circuit shown in FIG. 3, thereby enabling an accomplishment of both of a high speed response and stability against the load current variation in a balance.

The capacitance C1 of FIG. 7 functions as stabilization capacitance for a reference voltage LDAREF of the load driving amplifier. The capacitance CC1 functions as phase compensation capacitance.

The circuit of the present invention shown in FIG. 7 accomplishes a unique advantage, in addition to a benefit of a high speed response as in the case of the circuit shown in FIG. 3, as described in the following.

Referring to FIG. 7, the case of one load driving amplifier is shown here for simplicity. In an actual application, however, it is sometimes desirable to furnish each of different unit of controlling with a plurality of power supplies and of power supply circuits. For example, a conceivable case is to divide an internal chip circuit and equip with a circuit part for retaining contents of a register, memory, et cetera, by supplying it with the power continuously, and a circuit part for reducing a leakage current by shutting off the power except during an operation.

Thus, in the case that there is a plurality of power supply zones within a chip, with an internal power supply voltage VDD being generated by a regulator circuit as shown in FIG. 7, it is natural to furnish with the same number of power supply circuits, that is, circuits equivalent to the load driving amplifier AMPLD2, as the number of power supply zones.

Considering such an actual situation, the conventional circuit shown in FIG. 3 is faced with the problems of elements requiring a matching and of a layout thereof. In order to make the potentials of an internal power supply voltage VDD and of a drain voltage VDDR identical in high accuracy for the conventional circuit shown in FIG. 3, the element characteristics of the PMOS transistors MPS and MPSR must be identical.

In the case of furnishing with a plurality of power supply circuits, that is, the load driving amplifiers, respective load driving amplifier circuits are desirably to be placed close to digital circuits constituting as the load therefor from the viewpoint of minimizing an internal power supply line length. In such event, the replica amplifier AMPLD1R and load driving amplifier AMPLD1 are placed in different spots of a chip in the case of the conventional circuit shown in FIG. 3.

If a plurality of circuits, each of which is equivalent to the load driving amplifier AMPLD1, is placed close to digital circuits constituting as the loads, a distance between the PMOS transistors MPSR and MPS on a chip becomes large. It is of course important to make layout forms of elements identical in order to make characteristics of the elements identical; a closeness of the physical distance, however, is also very important for obtaining a better characteristic being identical. As a distance between the PMOS transistors MPSR and MPS on a chip becomes large, a degree of characteristics being identical degrades. As such, the conventional circuit shown in FIG. 3 has been faced with the problem of degraded voltage accuracy as a result of the distance between the PMOS transistors MPSR and MPS, characteristics of which need to be identical, on a chip becoming large in the case of using a plurality of circuits, each of which is equivalent to the load driving amplifier AMPLD1.

Contrarily, for the circuit according to the present invention shown in FIG. 7, the element characteristics of the NMOS transistors MND1 and MND2 need to be identical in order to make the potentials of the internal power supply voltage VDD and drain voltage VDDR identical in high accuracy. As for the circuit of FIG. 7, even if a plurality of circuits, each of which is equivalent to the load driving amplifier AMPLD2, is placed close to digital circuits constituting the load, the distance between the NMOS transistors MND1 and MND2 requiring a matching (i.e., the characteristics being identical) does not become large. Since the elements requiring a matching (i.e., the characteristics being identical) are transistors comprised by the load driving amplifier AMPLD2, the distance between the elements requiring a matching never becomes large no matter where the load driving amplifiers are placed, unlike the conventional circuit shown in FIG. 3.

That is, the circuit according to the present invention shown in FIG. 7 has the load driving amplifier AMPLD2 constituted by the differential pair NMOS transistors MND1 and MND2, output transistor MPP1 and load PMOS transistor MPL1, and makes the output signal DIVO1 of the resistance voltage division circuit RF1 and RF2 as an input to the load driving amplifier AMPLD2, thereby making the NMOS transistors MND1 and MND2, which constitute a differential circuit within the load driving amplifier AMPLD2, as elements requiring a matching (i.e., the characteristics being identical). This configuration obtains the benefits of preventing a distance between elements requiring a matching (i.e., the characteristics being identical) from becoming large and avoiding a degradation of voltage accuracy even in the case of using a plurality of load driving amplifiers.

For the circuit according to the present invention shown in FIG. 7, the resistors RF1, RF2, RF1R and RF2R are elements added anew as compared to the conventional circuit shown in FIG. 3, the accuracy of these parts also influences accuracy of an output voltage VDD. As already discussed, however, a relative accuracy (i.e., matching) of a resistor is generally expected to be higher than that of a MOS transistor, and therefore a degradation of accuracy in these parts is small. As for accuracy of resistors in this part, the elements requiring relative accuracy are the resistors RF1 and RF2 which are placed close to each other, likewise the NMOS transistors MND1 and MND2, and therefore the elements requiring a matching are limited to ones placed in the inside or close to the respective load driving amplifiers. This configuration obtains a benefit of accomplishing a circuit characteristic suitable to using a plurality of load driving amplifiers also relating to the resistance voltage division circuit.

Figure 5:
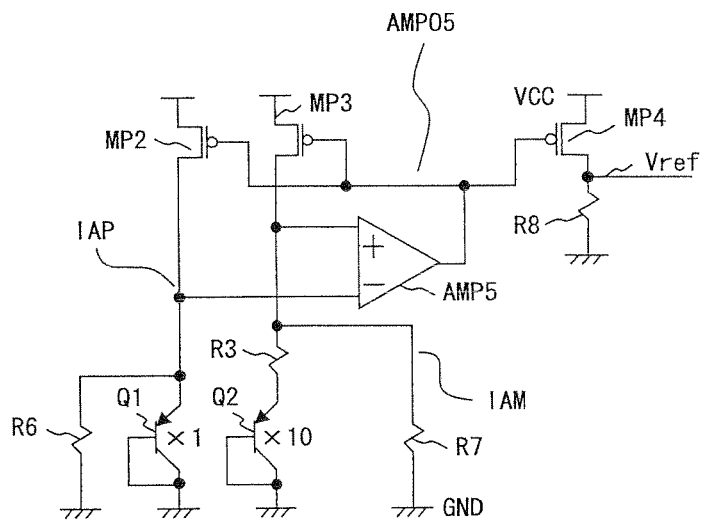
FIG. 5 shows a configuration of a second bandgap circuit.
Figure 6:
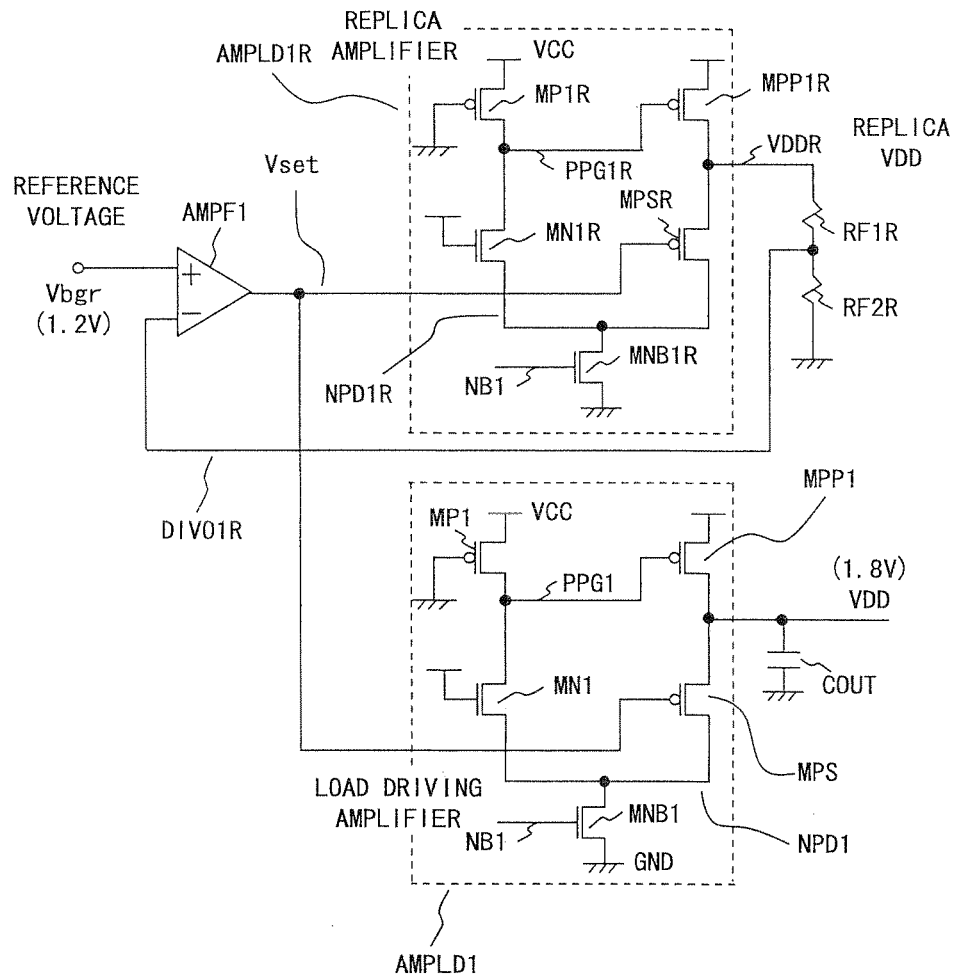
FIG. 6 shows a configuration of a regulator circuit according to a modified example of the third conventional example.

Meanwhile, a reference voltage for FIG. 7 is configured as a bandgap voltage Vbgr (of 1.2 volts) by using the resistors RF1, RF2, RF1R and RF2R. This configuration eliminates the necessities of processing a bandgap voltage Vbgr to be 1.5 times or using an electric-current mode bandgap circuit (refer to FIG. 5), unlike the conventional circuit shown in FIG. 3, thereby obtaining a benefit of avoiding an increase of a voltage error of the reference voltage.

Figure 9:
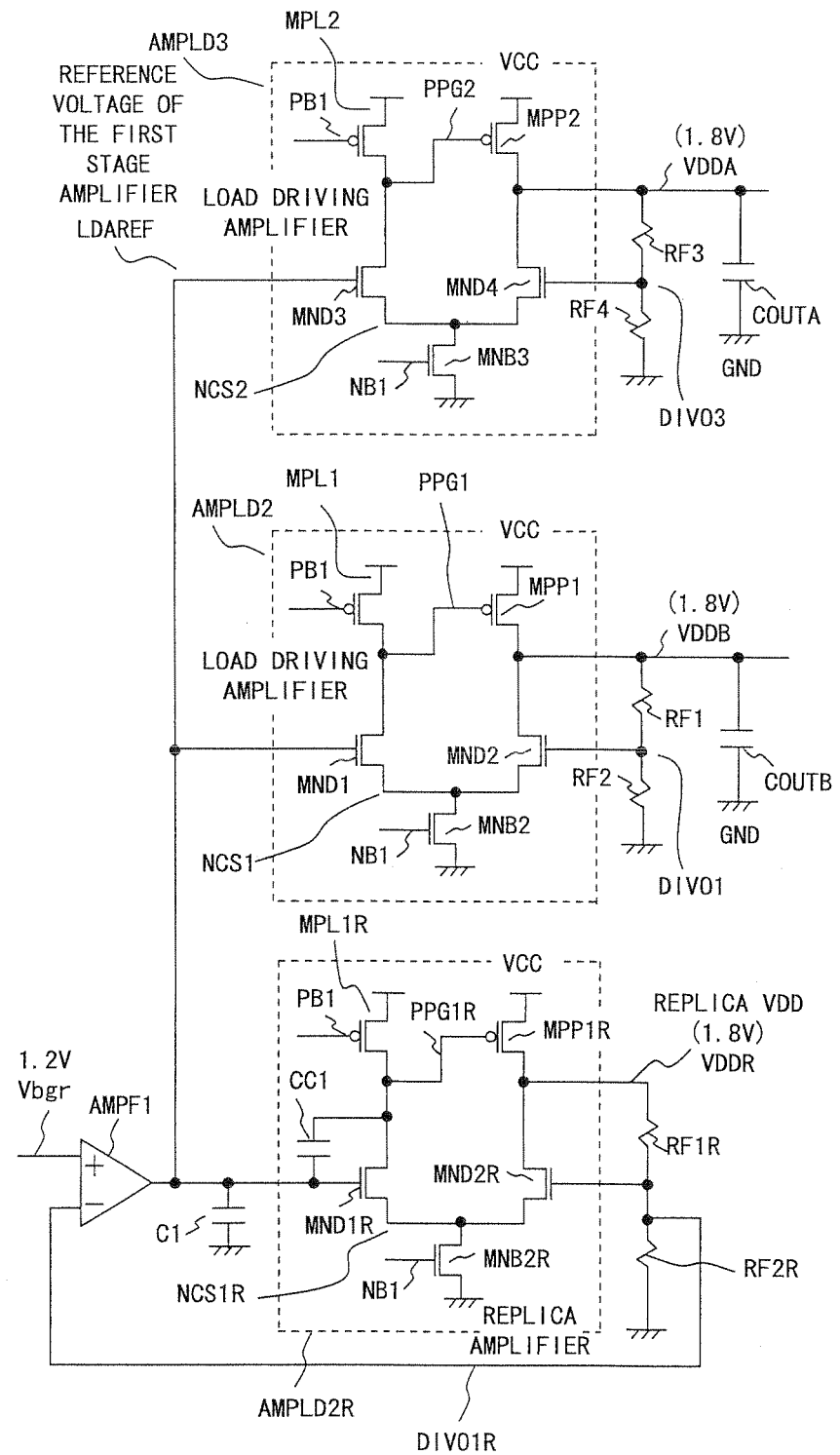
FIG. 9 shows a circuit configuration of a second modified example according to the first embodiment.

The next is a specific description of a modified example of the present embodiment by referring to FIG. 8 through 10.

FIG. 8 shows a circuit configuration of a first modified example according to the present embodiment.

The first modified example comprises the load driving amplifiers AMPLD2 and AMPLD3. These are fundamentally configured the same, for which the elements constituting the load driving amplifier AMPLD3 and signals output from the elements are each attached by a changed number, as sign, positioned last in the sign of the component corresponding to the load driving amplifier AMPLD2, likewise the FIG. 7. Here, used is a number adding 1 or 2 to the previous number. For example, a PMOS transistor corresponding to the PMOS transistors MPL1 is attached by MPL2 as sign, and an NMOS transistor corresponding to the NMOS transistor MND2 is attached by MND4. As the correlation is made apparent in this way, a detailed description is omitted here.

In the load driving amplifier AMPLD3, a voltage division circuit constituted by the serially connected resistors RF3 and RF4 connects between the drain of a PMOS transistor MPP2 and the ground GND. By this, the gate of the NMOS transistor MND4 is input by an output signal DIVO3 obtained by dividing an internal power supply voltage (i.e., a drain voltage) VDD by a resistance ratio of the resistors RF3 to RF4. The drain of the PMOS transistor MPP2 is additionally connected to a capacitor COUT.

In the first modified example shown in FIG. 8, the internal power supply voltages VDD output from the two load driving amplifiers AMPLD2 and AMPLD3, respectively, premise a common wiring. As compared to the case of furnishing only one load driving amplifier, a distance to a circuit block to supply a load current can be further shortened, thereby making it possible to further minimize wiring resistance and suppress a voltage drop due to the wiring resistance. And, even though there are two load driving amplifiers, a distance between the NMOS transistors requiring a matching can be short, and therefore it is possible to firmly avoid a degradation of voltage accuracy of the internal power supply voltage VDD by the aforementioned distance becoming large. Incidentally, there may be three or more of the load driving amplifiers.

FIG. 9 shows a circuit configuration of a second modified example according to the present embodiment.

The second modified example is configured to furnish the load driving amplifiers AMPLD2 and AMPLD3 with stabilization-use capacitors COUTB and COUTA, respectively, for internal power supply voltages VDDB and VDDA. By this configuration, the second modified example assumes a supply of load currents to different circuit blocks from the respective load driving amplifiers AMPLD2 and AMPLD3. Incidentally, there may be three or more load driving amplifiers. An alternative configuration may be for a plurality of load driving amplifiers to supply the same circuit block with a load current.

While the circuit shown in FIG. 8 has exemplified a circuit using the two amplifiers, that is, the load driving amplifiers AMPLD2 and AMPLD3 with the respective output being the internal power supply voltage VDD and commonly used, it is also possible to configure to make voltages VDDA and VDDB independent internal power supply voltages as the circuit shown in FIG. 9. In FIG. 9, the gates of the NMOS transistors MNB2 and MNB3 are shown as common bias signal NB1 for simplicity of delineation; respective independent controls of gate potentials of the NMOS transistors MNB2 and MNB3, however, enables a control as activating only the internal power supply voltage VDDA, or VDDB, with the other load driving amplifier being turned off. Also, it is apparently possible to increase the number of load driving amplifiers to be comprised, and expand the control thereof in various manners, in lieu of being limited to the two of them, for both of the cases shown in FIGS. 8 and 9.

If the internal power supply voltages VDDA and VDDB are configured to be independent, it is possible to accomplish such an operation as to reduce the power (i.e., "power-down") of either one only and reduce a leakage current.

Except where the voltages VDDA and VDDB constitute separate internal power supply points, the fundamental operation is the same as in the case of the circuits shown in FIGS. 7 and 8, and therefore detail descriptions of operations of the other parts are omitted here.

FIG. 10 shows a circuit configuration of a third modified example according to the present embodiment.

The third modified example is configured to further modify the second modified example so as to operate each amplifier independently. Accordingly, the same component signs are attached to the same one or fundamentally the same one, as in the second modified example. Referring to FIG. 10, PDAX, PDBX and PDRX are control signals for the purpose (i.e., power-down control signals). Since the difference from the second modified example lies in the part relating to these control signals, a specific description is provided for the part.

The control signal PDAX is used for a load driving amplifier AMPLD4. The control signal PDAX is input to the gate of a PMOS transistor MP2 of which the source is applied an external power supply voltage VCC and the drain is connected to the gate of a PMOS transistor MPP2. The signal is also input to the respective gates of an NMOS transistor MN4 of which the drain is connected to the source of an NMOS transistor MN3 and the source is connected to the ground GND, and of an NMOS transistor MN5 of which the drain is connected to a resistor RF4 and the source is connected to the ground GND. The NMOS transistor MN3 corresponds to the NMOS transistor MNB3 shown in FIG. 9, and the drain of the NMOS transistor MN3 is connected to the respective source of NMOS transistors MND3 and MND4 while the gate is input by a signal NB2 corresponding to the signal NF1. NMOS transistors MN6 and MN9 comprised by a load driving amplifier AMPLD5 and of a replica amplifier AMPLD4R, respectively, correspond to the NMOS transistors MNB2 and MNB2R shown in FIG. 9, respectively. The reason for making the sign, as NB2, of a signal input to the gate of the NMOS transistor MN3 is that, considering on-resistance of the NMOS transistor MN4, a current flowing therein needs to be set appropriately.

Based on the configuration as described above, in the load driving amplifier AMPLD4, when the control signal PDAX is turned to L (i.e., the low level; 0 volt for example), a potential of a signal PPG2 is turned to H level (i.e., an external power supply voltage VCC level), thereby stopping a flow of current in the PMOS transistor MPP2, and likewise in the NMOS transistors MN4 and MN5. Contrarily, when the control signal PDAX is turned to H, the respective MOS transistors MPP2, MN4 and MN5 becomes states of allowing a flow of current. Because of this, it is possible to operate the load driving amplifier AMPLD4 independently by the control signal PDAX.

The above noted NMOS transistor MN4 corresponds to NMOS transistors MN7 and MN10 comprised by other amplifiers AMPLD5 and AMPLD4R, respectively. The NMOS transistor MN5 corresponds likewise to NMOS transistors MN8 and MN11. Therefore, the other amplifiers AMPLD5 and AMPLD4R can also be independently operated by the control signals PDBX and PDRX, respectively. Note that an NMOS transistor receiving an input of a constant signal NB2 to its gate may be placed at a position where the source is connected to the ground GND.

The following is a specific description on each of external circuits to be combined for operating the first embodiment or its modified examples by referring to FIGS. 11 through 14.

Figure 11:
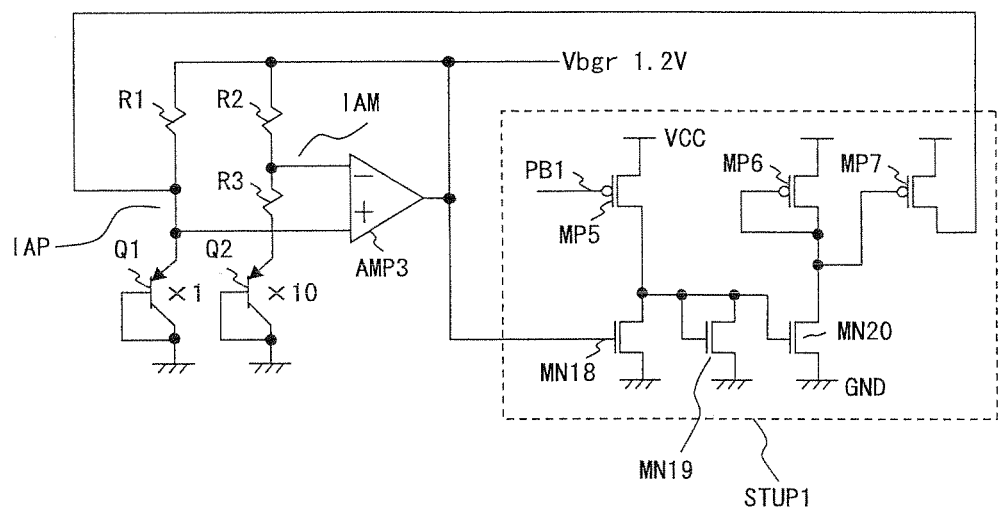
FIG. 11 shows a configuration of a bandgap circuit to be adopted.

FIG. 11 shows a configuration of a bandgap circuit. The circuit is disposed for supplying a bandgap voltage Vbgr. In the showing of FIG. 11, a Q1 and Q2 are pnp type bipolar transistor (noted as "pnp transistor" hereinafter), an R1 through R3 are resistors, an AMP3 is an operational amplifier circuit, an IAM and IAP are internal nodes, an MP5 through MP7 are PMOS transistors, an MN18 through MN20 are NMOS transistors, and a STUP1 is a startup circuit. The "x1" and "x10" respectively attached to the pnp transistors Q1 and Q2 are ratios of relative area size between them, that is, the area size of the transistor Q1 is one tenths (1/10) of that of the transistor Q2. Also, likewise, the same sign is attached to a signal used for the first embodiment or its modified examples. This is the same hereinafter.

Figure 4:
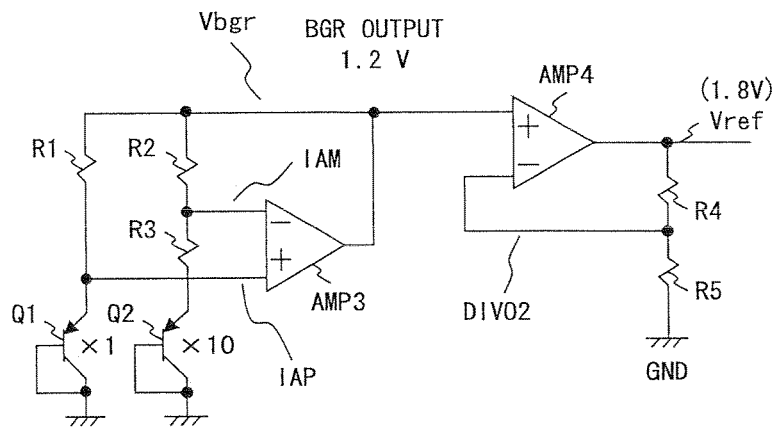
FIG. 4 shows a configuration of a first bandgap circuit.

The respective operations of the resistors R1 through R3, pnp transistors Q1 and Q2, and operational amplifier circuit AMP3 in the configuration of FIG. 11 are fundamentally the same as in the case of the bandgap circuit shown in FIG. 4. Therefore, the description here focuses on the other part, that is, the startup circuit STUP1.

The operational amplifier circuit AMP3 controls so as to make potentials of the nodes IAM and IAP identical, thereby generating a bandgap voltage Vbgr. In the case of a current not flowing either in the pnp transistor Q1 or Q2, however, the potential of the nodes IAM and IAP is still identical, that is, the ground (GND) potential, resulting in reaching at a stabilization point. In order to avoid this unfavorable stabilization point, the startup circuit STUP1 is used.

At the startup circuit STUP1, a signal output from the operational amplifier circuit AMP3 is input to the gate of the NMOS transistor MN18 of which the drain is connected to the following points, i.e., the drain of the PMOS transistor MP5, of which the gate is input a signal Psi, the drain of the NMOS transistor MN19 and the gate of the NMOS transistor MN20.

The signal PB1 is a signal of a certain constant potential. Accordingly, if a potential of a signal input to the gate of the NMOS transistor MN18 is zero ("0") volt, a current from the PMOS transistor MP5 does not flow into the NMOS transistor MN18, and instead flows into the NMOS transistors MN19 and MN20. The flowing of the current to the gate of the NMOS transistor MN20 causes a current to flow into the PMOS transistor MP6 and the PMOS transistor MP7 which constitute a current mirror circuit together therewith. This in turn makes a current flow into the pnp transistor Q1, making a potential of the node IAP increase, resulting in generating a potential difference between the nodes IAP and IAM. As a result, the operational amplifier circuit AMP3 makes a transition to a state of controlling so as to equalizing the potentials of the nodes IAP and IAM.

By the transition to the state, a bandgap voltage Vbgr, which is the voltage of an output signal of the operational amplifier circuit AMP3, becomes a potential unequal to zero ("0") volt. Inputting such a signal to the gate of the NMOS transistor MN18 causes a current supplied from the PMOS transistor MP5 to flow into the NMOS transistor MN18, resulting in hardly flowing to the other NMOS transistors MN19 and MN20. By this, the startup circuit STUP1 hardly influences a potential of the node IAP thereafter. A circuit configuration of the startup circuit STUP1 is not limited to the one shown in FIG. 11. Any circuit accomplishing the purpose of making a transition from an unfavorable stabilization state may be widely adopted.

Figure 12:
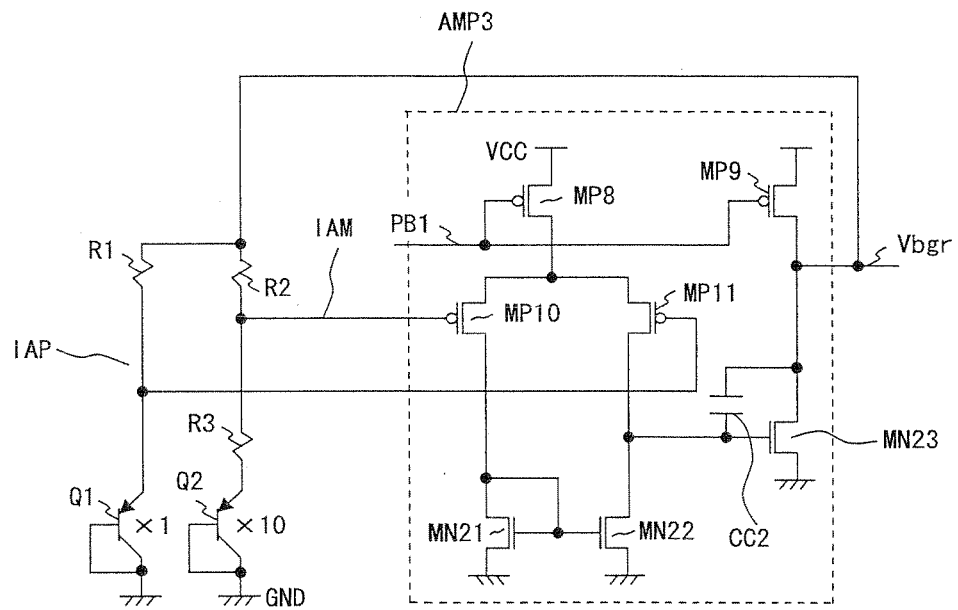
FIG. 12 shows an example configuration of an operational amplifier circuit AMP3.

FIG. 12 shows an example configuration of the above described operational amplifier circuit AMP3. In the showing of FIG. 12, an MP8 through MP11 are PMOS transistors, an MN21 through MN23 are NMOS transistors and a CC2 is a capacitor.

For the operational amplifier circuit AMP3 shown in FIG. 12, the PMOS transistors MP8 and MP9, the gates of which are input by a signal PB1 of a certain constant potential, function as a current source. The MOS transistors MP8, MP10, MP11, MN21 and MN22 function as the first stage amplifier, while MOS transistors MP9 and MN23 function as the second stage amplifier, thereby configuring a common two-stage amplifier as a whole. Such configured operational amplifier circuit AMP3 has a small number of elements and therefore is capable of suppressing an offset voltage to a minimum.

Figure 13:
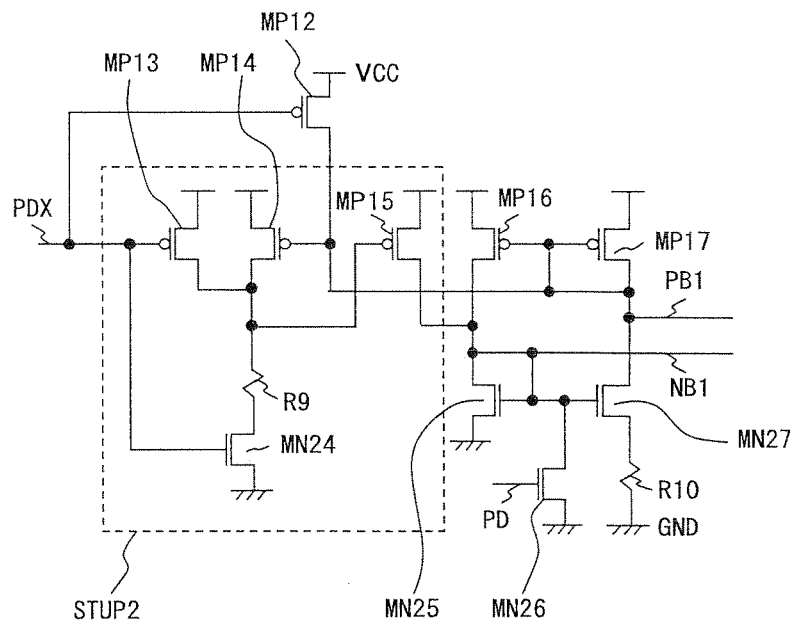
FIG. 13 shows an example configuration of a bias circuit usable for generating signals PB1 and NB1.

FIG. 13 shows an example configuration of a bias circuit usable for generating signals PB1 and NB1. In the showing of FIG. 13, an R9 and R10 are resistors, an MP12 through MP17 are PMOS transistors, an MN24 through MN27 are NMOS transistors, and a STUP2 is a startup circuit.

For this circuit, the MOS transistors MP16, MP17, MN25, MN27 and the resistor R10 function as loop for determining an operating point. The startup circuit STUP2 is operated for the same purpose as that of the startup circuit STUP1 shown in FIG. 11. A potential (i.e., a bias voltage) of a signal NB1 is a voltage across the gate and source of the NMOS transistor MN25, while a potential (i.e., a bias voltage) of a signal PB1 is a sum of a voltage across the drain and source of the NMOS transistor MN27 and a voltage across the terminals of the resistor R10.

Control signals PXD and PD are used for the circuit. The control signal PDX is input to the respective gates of the MOS transistors MP12, MP13 and MN24, while the control signal PD is input to the gate of the NMOS transistor MN26. At the time of a normal operation, the control signals PDX and PD are controlled to be H and L, respectively, while at the time of a stoppage the control signals PDX and PD are controlled to be L and H, respectively.

A configuration of the bias circuit is not limited to the one shown in FIG. 13. Any circuit capable of generating a signal of a certain constant potential stably and highly accurately may be widely adopted.

FIG. 14 shows an example configuration of the above noted operational amplifier circuit AMPF1. In the showing of FIG. 14, an MP18 through MP21 are PMOS transistors, and an MN28 through MN32 are NMOS transistors.

In this circuit, the NMOS transistors MN28 through MN30 constitute a differential circuit and the PHOS transistors MP18 and MP19, which constitute a load for the differential circuit, constitute current mirror circuits with the PMOS transistors MP20 and MP21, respectively. An output signal DIVO1R is input to the gate of the NMOS transistor MN28, and a bandgap voltage Vbgr is applied to the gate of the NMOS transistor MN29. A current from the PMOS transistor MP20 flows into the NMOS transistor MN31 and the NMOS transistor MN32 constituting a current mirror circuit therewith. By this, currents respectively flowing in the NMOS transistors MN28 and MN29 of the differential circuit, flows into the MOS transistors MN32 and MP21 (i.e., copied). An output signal LDAREF is a signal output from the drain of the PHOS transistor MP21. As a result, outputted is an output signal LDAREF of a potential according to a potential difference between the output signal DIVO1R and bandgap voltage Vbgr.

A circuit configuration as shown in FIG. 14 is relatively simple and a voltage range of the output signal LDAREF may be made relatively wide. A circuit configuration different from the one shown in FIG. 14 may be adopted.

Second Embodiment

The circuit shown by FIG. 7 has exemplified a circuit in the case of using each one of a replica amplifier (i.e., AMPLD2R) and a load driving amplifier (i.e., AMPLD2). Although the simplest circuit configuration has been shown for describing a fundamental operation, the circuit shown by FIG. 7 is faced with the case of an excessive increase of the potential of the internal power supply VDD occasionally at the time of turning the power on. In such a case, it is possible to prevent a potential of the internal power supply VDD from increasing excessively at the time of turning the power by configuring a circuit as shown by FIG. 15. The next is a description of a difference of the operation at the time of turning on the power between the circuit shown by FIG. 15 and the one shown by FIG. 7.

FIG. 15 shows a configuration of a regulator circuit according to the second embodiment. In the showing of FIG. 15, the same component sign is attached to the same component or fundamentally the same one as that of FIG. 7. The description here accordingly focuses on the signs unfound in FIG. 7.

The second embodiment is configured to add an amplifier AMPLDS2 for charging a capacitance COUT at the time of turning on the power, in addition to the load driving amplifier AMPLD2. For the power on-use amplifier AMPLDS2, an external power supply voltage VCC is applied to the drain of an NMOS transistor MNCS1 and the respective sources of PMOS transistors MPLS1 and MPPS1, and the source of the NMOS transistor MNCS1 and the drain of the PMOS transistor MPLS1 are connected to the drain of an NMOS transistor MNDS1 and the gate of the PMOS transistor MPPS1. An output signal LDAREF is input to the gate of the NMOS transistor MNDS1 of which the source is connected to the drain of an NMOS transistor MNBS2. A signal NB1 is input to the gate of the NMOS transistor MNBS2 of which the source is connected to the ground GND.

Meanwhile, the drain of the PMOS transistor MPPS1 is connected to the drain of the NMOS transistor MNDS2 and the capacitor COUT. An output signal DIVO1 is input to the gate of the NMOS transistor MNDS2 of which the source is connected to the drain of an NMOS transistor MNBS2 and the source of the NMOS transistor MNDS1.

The gate of a PMOS transistor MPP1 comprised by the load driving amplifier AMPLD2 is connected to the drain of the PMOS transistor MP22 of which the source is applied an external power supply voltage VCC. An output signal RSTLX of an inverter circuit INV1 is output to the gate of the PMOS transistor MP22. The inverter circuit INV1 receives an input of a signal RSTL output from a low voltage detection circuit shown in FIG. 16, inverts the signal RSTL and outputs it as an output signal RSTLX.

At this point, descriptions are on the purposes and functions of the above noted power on-use amplifier AMPLDS2, signal RSTL, inverter circuit INV1 and PMOS transistor MP22.

The PMOS transistor MPP1 is configured to be a large size because it must be capable of supplying a maximum current at the time of a digital circuit in operation. Charging the capacitor COUT by the transistor MPP1 sometimes makes an internal power supply voltage VDD exceed the specified 1.8 volts and overshoot. Therefore, a smaller sized PMOS transistor is used for charging the capacitor COUT at the time of turning on the power, at which time the PMOS transistor MPP1 is forcibly turned off, thereby preventing such an overshoot. The power on-use amplifier AMPLDS2 is furnished specifically for the power on-use.

The signal RSTL remains H for a certain period of time immediately after turning on the power. Due to this, the signal RSTLX remains as L until the certain period elapses, during the state of which the PMOS transistor MP22 becomes an On state, and a potential of the signal PPG1 becomes equal to the external, power supply voltage VCC. As a result of this, the PMOS transistor MPP1 is forced to remain Off for a certain period of time immediately after turning on the power, followed by being turned On when the certain period elapses.

The PMOS transistor MPPS1 used for a charging during the certain period is configured as a smaller size than that of the PMOS transistor MPP1 and as the minimum size required for charging the capacitor COUT within the certain time. The PMOS transistor MPPS1 is designed to be optimum independent of the PMOS transistor MPP1. The reason for designing the size as the required minimum size is for being capable of minimizing an overshoot amount (i.e., an amount exceeding 1.8 volts in this case).

Except for the NMOS transistor MNCS1 having been added, the configuration of the load driving amplifier AMPLDS2 is basically the same as those of other amplifiers AMPLD2 and AMPLD2R.

A size of the PMOS transistor MPPS1 is desirably one capable of charging the capacitor COUT within the certain period of time during which the signal RSTL remains as H even under the condition of the resistance of the PMOS transistor MPPS1 being the maximum. The condition of the resistance being the maximum is one such as an external power supply voltage VCC being the minimum, a threshold voltage Vth being the maximum and the temperature being the maximum. A determination of a size under such condition makes a resistance value of the PMOS transistor MPPS1 smaller as compared to the case of the external power supply voltage VCC being the minimum in the case of the voltage VCC being the maximum.

The purpose of using the PMOS transistor MPPS1 for charging the capacitor COUT is for preventing an overcharging. Because of this, a large change of the resistance is undesirable. However, a wide range of an external power supply voltage VCC for which the regulator circuit is responsive is desirable and therefore an equivalent resistance value of the PMOS transistor MPPS1 depends greatly on the external power supply voltage VCC, and the resistance value changes considerably. Therefore, the NMOS transistor MNCS1 is equipped for preventing the aforementioned resistance value from changing considerably.

In the case of an external power supply voltage VCC being at 2 volts for example, a potential of a signal PPGS1 input to the PMOS transistor MPPS1 becomes the ground (GND) level. If the NMOS transistor MNCS1 does not exist, the potential of the signal PPGS1 becomes the ground (GND) level even when an external power supply voltage VCC is 4 volts. Therefore, voltage across the gate and source of the PMOS transistor MPPS1 is approximately the same as the power supply voltage VCC, and the on-resistance changes considerably depending on the power supply voltage VCC.

Comparably, if the NMOS transistor MNCS1 exists, a potential of the signal PPGS1 becomes the ground (GND) level if an external power supply voltage VCC is 2 volts for example. However, even if the power supply voltage VCC increases to 4 volts, the potential does not reach a lower voltage than a voltage which is lower than the gate voltage of the NMOS transistor MNCS1 by a threshold voltage Vth. That is, the potential of the signal PPGS1 does not reach a lower voltage than a voltage which is lower than the potential of the signal PB1 approximately by the threshold voltage Vth. Therefore, the voltage across the gate and source of the PMOS transistor MPPS1 no longer greatly depend on the power supply voltage VCC. This in turn prevents the on-resistance of the PMOS transistor MPPS1 from being greatly changed depending on the power supply voltage VCC. It is possible to prevent an overcharge of the capacitor COOT because the resistance does not change greatly.

Meanwhile, for the power on-use amplifier AMPLDS2, the NMOS transistor MNCS1 clips a potential of a signal PPGS1 so as to prevent the gate potential of the CMOS transistor MPPS1 from becoming too low in the case of a power supply voltage VCC being large, thereby lessening a power supply voltage dependence of a resistance of the PMOS transistor MPPS1. This firmly prevents the resistance from being changed greatly by a power supply voltage VCC and accordingly makes it possible to always charge the capacitor COUT adequately.

Note that the signal PB1 is input to the gate of the NMOS transistor MNCS1, a signal may be any one if it is for preventing the gate potential from decreasing too much.

The next is a description on functions of the PMOS transistors MP23 and MP24, NMOS transistor MN33 and resistor RSF1. These elements are disposed for suppressing a potential of a capacitor COUT exceeding a defined voltage value of an internal power supply voltage VDD.

A source potential of the PHOS transistor MP23 is a drain voltage VDDR. A drain potential of the NMOS transistor MN33 is lowered from a drain voltage VDDR approximately by a threshold voltage Vth of the PMOS transistor MP23 by making a constant current in the NMOS transistor MN33 of which the gate receives an input of a signal NB1. Agate potential of the PMOS transistor MP24, that is, a potential of a signal NPGS1 increases from the drain voltage by the amount of: a resistance value RSF1 multiplied by a current value of the NMOS transistor MN33. By this, if the potential of the internal power supply voltage VDD exceeds the drain voltage VDDR by the amount of: the resistance value RSF1 multiplied by a current value of the NMOS transistor MN33, the voltage across the gate and source of the PMOS transistors MP24 exceeds the threshold voltage Vth, resulting in a current flowing thereinto. Therefore, an increase of the internal power supply voltage VDD in excess of a desired value (i.e., 1.8 volts herein), that is, an overcharging of the capacitor COUT, results in being suppressed.

An NMOS transistor MN34 functions as making a current flow only for a certain period after turning on the power. Because of this, a signal NIST input to the gate becomes H only for a certain period from the point of a signal RSTL changing from H to L. The reason for this is that there is a possibility of overcharging the capacitor COUT as a result of charging it by the PMOS transistor MPPS1. Therefore, it is configured to have the NMOS transistor MN34 flush an amount of the overcharge to the ground GNU after the end of the charging, thereby preventing the potential of the internal power supply voltage VDD from climbing too high.

As such, the circuit shown in FIG. 15 is configured to furnish it with the power on-use amplifier AMPLDS2 in addition to the load driving amplifier AMPLD2 and charge the capacitance COUT by the amplifier AMPLDS2 at the time of turning on the power, thereby preventing a potential of the internal power supply voltage VDD from climbing from a desired value to an excessively high potential as a result of overcharging the capacitance COUT.

Also, the power on-use amplifier AMPLDS2 is configured to clip a potential of the signal PPGS1 by the NMOS transistor MNCS1 so as to prevent a gate potential of the output transistor MPPS1, which is for charging the capacitance COUT at the time of turning on the power, from decreasing to an excessively low potential when an external power supply voltage VCC is high, thereby lessening a dependence, on a power supply voltage, of a resistance of the output transistor MPPS1. This configuration makes it possible to prevent the resistance value of the output transistor MPPS1 from being changed greatly by the external power supply voltage VCC, thus contributing to preventing an excessive increase of a potential of the internal power supply voltage VDD.

FIG. 15 has shown the circuit establishing a gate potential of the NMOS transistor MNCS1 as the potential PB1, the gate potential of the NMOS transistor MNCS1, however, may be a potential and a signal in line with the purpose of preventing a potential of the signal PPGS1 from lowering itself to too low, in lieu of being limited to the potential PB1. Various modifications in line with the purpose are possible.

Meanwhile, the PMOS transistor MP24 and its generation part of a gate voltage NPGS1 contribute to preventing an excessive increase of a potential of the internal power supply voltage VDD.

Furthermore, a benefit of preventing an excessive increase of a potential of the internal power supply voltage VDD at the time of turning on the power can be obtained by controlling the NMOS transistor MN34 to discharge a charge of the internal power supply voltage VDD.

Figure 16:
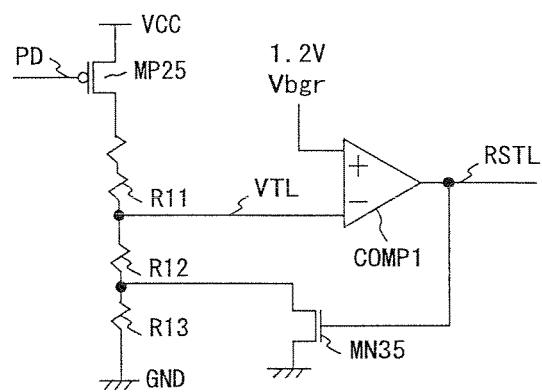
FIG. 16 shows an example configuration of a low voltage detection circuit.

FIG. 16 shows an example configuration of the above noted low voltage detection circuit. The next is a specific description on the circuit by referring to FIG. 16. In the showing of FIG. 16, an R11 through R13 are resistors, a COMP1 is a comparator circuit, an MP25 is a PMOS transistor, an MN35 is an NMOS transistor, and a VTL is an output signal output to the inverting input terminal of the comparator circuit COMP1 from a voltage division circuit constituted by the resistors R11 through R13.

A signal PD input to the gate of the PMOS transistor MP25 is a signal turned to L only at the time of a normal operation as noted above. Therefore, the comparator circuit COMP1 compares between a bandgap voltage Vbgr input to the non-inverting input terminal and an output signal VTL of a potential which is reduced by the amount corresponding to the resistor R11 from an external power supply voltage VCC supplied by way of the PMOS transistor MP25 during a normal operation. The comparison result is output as an output signal RSTL which remains as H for a certain period immediately after turning on the power.

The output signal RSTL is input to the gate of the NMOS transistor MN35 of which the drain and source are respectively connected to the terminals of the resistor R13. Due to this, almost all the current supplied from the resistor R12 flows in the NMOS transistor MN35 in the On state. In the Off state, the current flows in the resistor R13. By this, a voltage division ratio of a voltage division circuit constituted by the resistors R11 through R13 changes with the On and Off states of the NMOS transistor MN35. By utilizing this fact, the resistor R13 and NMOS transistor MN35 so function as accomplish a hysteresis characteristic.

Figure 17:
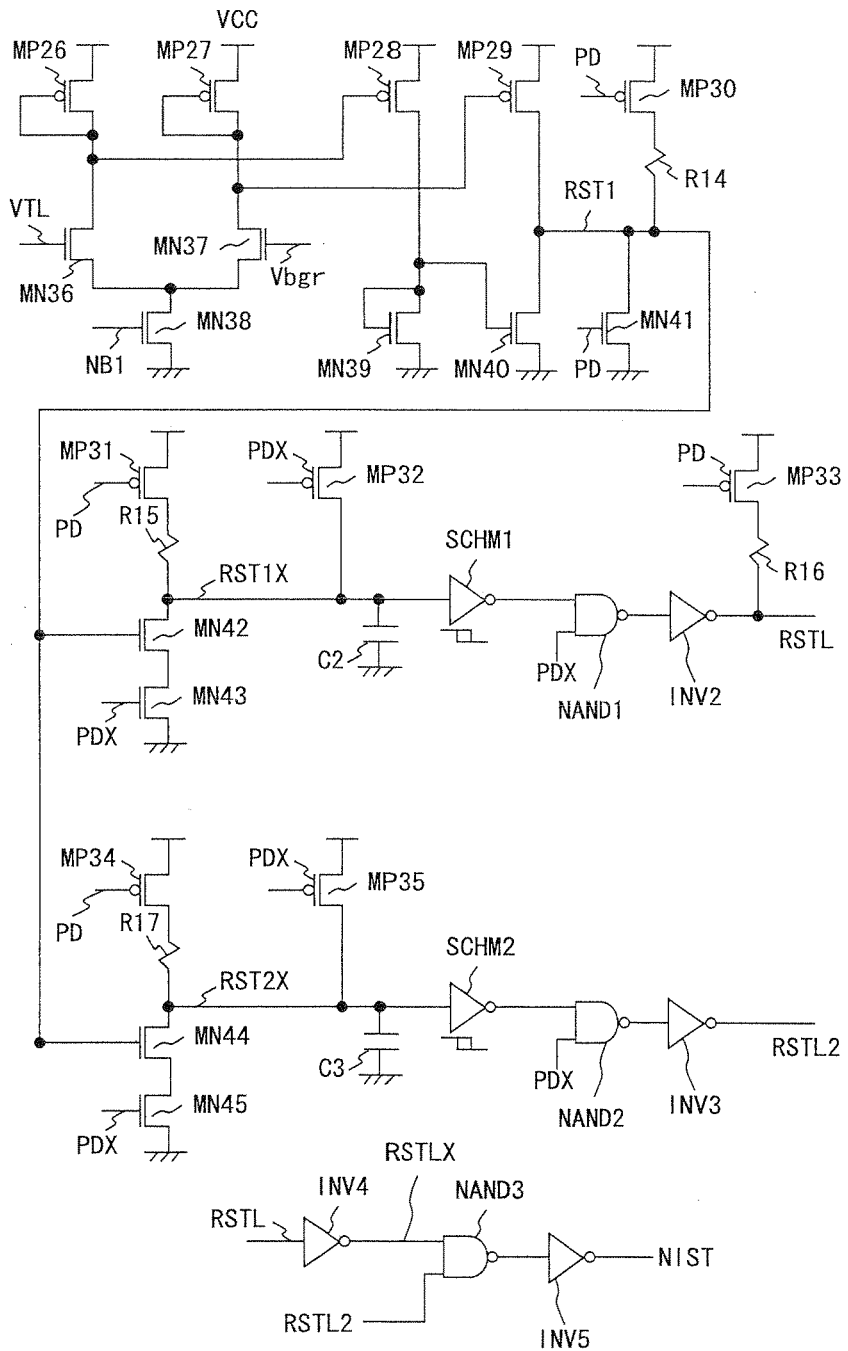
FIG. 17 shows an example configuration of a comparator circuit adoptable for a low voltage detection circuit.

FIG. 17 shows an example configuration of the above noted comparator circuit COMP1. In the showing of FIG. 17, an MP26 through MP35 are PMOS transistors; an MN36 through MN45 are NMOS transistors; an R14 through R17 are resistors; a C2 and C3 are capacitors; an RST1, RST1X, RSTL2 and RSTLX are internal nodes; an INV2 through INV5 are inverter circuits; a SCHM1 and SCHM2 are Schmitt circuits; and a NAND1 and NAND2 are NAND circuits. A signal PD is one being turned to L during a normal operation, and H at a stoppage. Conversely, a signal PDX is turned to H during a normal operation, and L at a stoppage.

An output signal VTL generated by a voltage division circuit is so set as to be of a lower potential than a bandgap voltage Vbgr. If the signal VTL has a higher potential than that of the bandgap voltage Vbgr, a current flowing in the NMOS transistor MN37 becomes larger than that flowing in the NMOS transistor MN36. The current of the transistor MN37 flows into the PMOS transistor MP29 which constitutes a current mirror circuit, while the current of the transistor MN36 likewise flows into the PMOS transistor MP28. By this, the current further flows into the NMOS transistor MN40. The current of the PMOS transistor MP29 is larger than that of the NMOS transistor MN40, and therefore a potential of the node RST1 is turned to H. The resistor R14 so functions as to make a potential of the node RST1 maintain an H in the case of a low power supply voltage VCC under which the transistors MN36 and MN37 do not operate.

As the potential of the node RST1 is turned to H, the NMOS transistor MN42 is turned On. This causes a potential of the node RST1X to be turned to L, resulting in a potential of the node (signal) RSTL being turned to H. The resistor R16, likewise the resistor R14, so functions as to have a potential of the node RSTL maintain at H in the case of a low power supply voltage VCC under which a comparison by the NMOS transistors MN36 and MN37 cannot be carried out adequately. If a potential of the signal VTL becomes lower than that of the bandgap voltage Vbgr, respective potentials of the nodes RST1 and RSTL are reversed, thus being turned to L and H, respectively.

In the case of a differential circuit constituted by the NMOS transistors MN36 and MN37 operating, it compares potentials between the signal VTL and bandgap voltage Vbgr, determining a potential of the node (signal) RSTL. At the time of a power supply voltage VCC rising, the circuit so operates as to determine the potential by the capacitor C2, independent of the aforementioned comparison.

When a potential of the signal VTL increases from being lower than the bandgap voltage Vbgr to exceeding it, a potential of the node RST1 is turned to L, the NMOS transistor MN42 being turned Off and a potential of the node RST1X starting to climb. The time for the climb can be designed by a time constant determined by the capacitor C2 and resistor R15.

At immediately after turning on the power, a period of time is required for the bandgap circuit to stabilize. If a potential of the signal VTL is compared with that of the bandgap voltage Vbgr before the stabilization, a right comparison result cannot necessarily be obtained. Because of this, the configuration is such as to have the capacitor C2 maintain the potential of the node RST1X as L, and that of the node RSTL as H during the time for stabilizing.

Let it be considered the case of a power supply voltage VCC rising up step-wise for example. In such a case, a potential of the signal VTL also rises up stepwise, and therefore the potential is higher than a bandgap voltage Vbgr immediately after turning on the power. In such a case, however, the node RST1X is maintained at L for the period determined by the time constant of the capacitor C2 and resistor R15, followed by being turned to H. By this, the node (signal) RSTL can be used not only as an output of a low voltage detection circuit but also as that of a power-on reset circuit.

Comparably, in the case of a power supply voltage VCC rising up ramp-wise, the NMOS transistor MN42 is maintained to be turned On until the signal VTL exceeds a potential of the bandgap voltage Vbgr, and therefore respective potentials of the nodes RST1X and RSTL are maintained as L and H, respectively. Once exceeding the potential, the potential of the node RST1 is turned to L, thereby starting to charge the capacitor C2, followed by changing the respective potentials of the nodes RST1X and RSTL to H and L, respectively, after a time determined by the time constant elapses.

Due to this, the signal RSTL output from the bandgap circuit is maintained as H for a certain period immediately after turning on the power. An input of such signal RSTL into the inverter circuit INV1 accomplishes the operation described above by referring to FIG. 15.

The NAND circuit NAND1 outputs a logical product by using a control signal PDX and therefore functions as circuit for fixing a signal RSTL to L at the time of a stoppage. This avoids an occurrence of a failure due to the signal RSTL being H at the time of a stoppage.

The next is a description on a circuit part for generating a signal NIST.

As a potential of the node RST1 is turned to L, the NMOS transistor NN44 is turned Off, starting to charge the capacitor C3 by the resistor R17. A potential of the node RSTL2 is maintained as L for a period determined by a time constant of the capacitor C3 and resistor R17, followed by the potential being turned to H. The signal NIST is generated by a circuit, which is constituted by the inverter circuits INV4 and INV5 and NAND circuit NAND3, processing respective potentials of the nodes RSTL2 and RSTL. A signal from the inverter circuit INV4 to the NAND circuit NAND3 is output by way of the node RSTLX.

If a design is such that a time constant (i.e., a product) calculated from the capacitor C3 and resistor R17 is larger than the one calculated from the capacitor C2 and resistor R15, a potential of the node RST2X is changed from an L to H after a potential of the node RST1X is changed to H. By this, respective potentials of the node RSTL and RSTL2 change in a manner in which the node RSTL changes from H to L firstly after the power is turned on, and then the node RSTL2 changes from H to L. Due to this, the signal NIST can be maintained as H only for a certain period after the node RSTL is changed from H to L.

FIG. 18A through 20C are graphs describing signals flowing in circuits shown in FIGS. 15 through 17, or operation waveform examples of nodes. The horizontal axis of these graphs indicates time, while the vertical axis indicates voltage or current.

FIG. 18A is a graph exemplifying an operation waveform (i.e., a temporal change) of an external power supply voltage VCC which rises up stepwise.

FIG. 18B is a graph exemplifying operation waveforms of an internal power supply voltage VDD and of a bandgap voltage Vbgr, and FIG. 18C is a graph exemplifying an operation waveform of a load current. As shown in FIG. 18C, a load current of approximately 50 milliamp. flows after an elapse of time of one millisec. following a stepwise rise of an external power supply voltage VCC, followed by ending the supply of the load current after the elapse of time of two millisec. The bandgap voltage Vbgr climbs as high as exceeding 1.5 volts immediately after turning on the power, followed by stabilizing at 1.2 volts as shown in FIG. 18B. The internal power supply voltage VDD climbs with a delay from the bandgap voltage Vbgr and stabilizes.

FIG. 18D is a graph exemplifying an operation waveform of the node RSTLX. The waveform is an inverse signal of the node RSTL, indicating that a potential of the node RSTL is turned to H for only a certain period immediately after turning on the power.

Figure 19A:
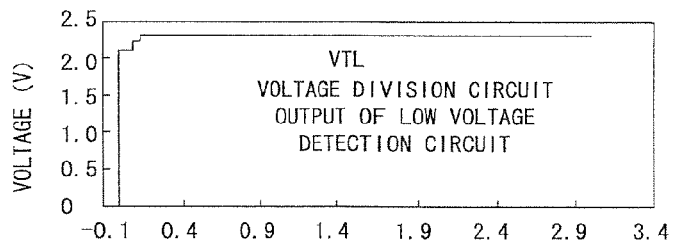
FIG. 19A through 19F are graphs describing signals being transmitted in circuits shown in FIGS. 15 through 17, or operation waveform examples of nodes (part 2)

FIG. 19A is a graph exemplifying an operation waveform of a signal VTL. The potential climbs up to approximately 2 volts after turning on the power.

Figure 19B:
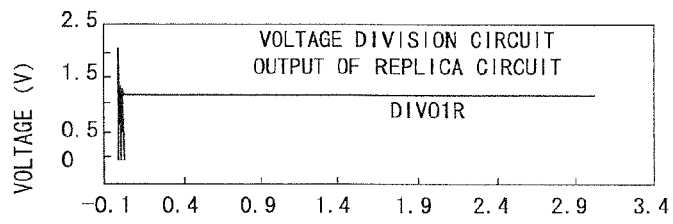
Figure 19C:
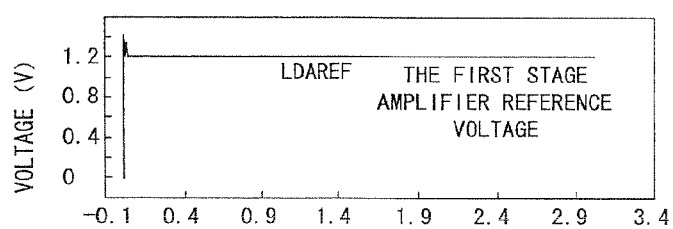
Figure 19D:
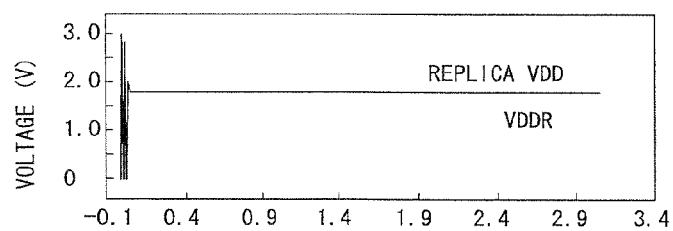

FIG. 19B is a graph exemplifying an operation waveform of a signal DIVO1R; FIG. 19O is a graph exemplifying an operation waveform of a signal LDAREF; FIG. 19D is a graph exemplifying an operation waveform of a drain voltage VDDR; and FIG. 19F is a graph exemplifying an operation waveform of a signal DIVO1. The individual signals and the voltage VDDR respectively stabilize immediately after turning on the power. The drain voltage VDDR stabilizes at 1.8 volts, and the signal DIVO1R stabilizes at 1.2 volts.

Figure 19E:
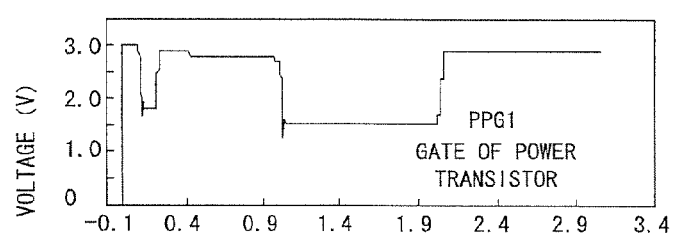
Figure 19F:
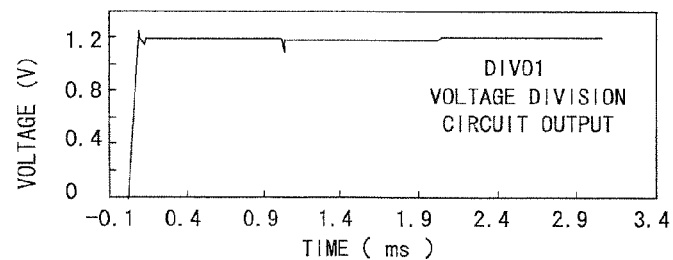
Figure 20A:
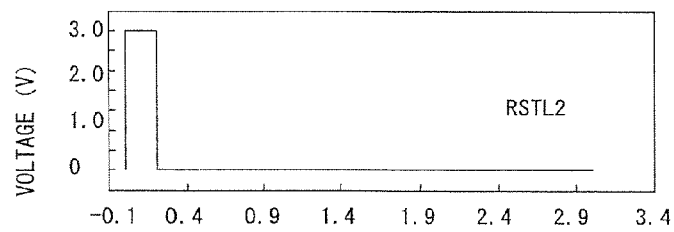
FIG. 20A through 20C are graphs describing signals being transmitted in circuits shown in FIGS. 15 through 17, or operation waveform examples of nodes (part 3)
Figure 20B:
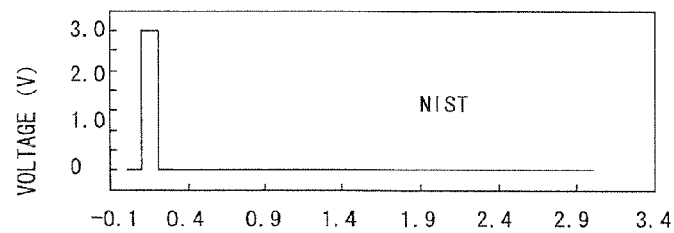
Figure 20C:
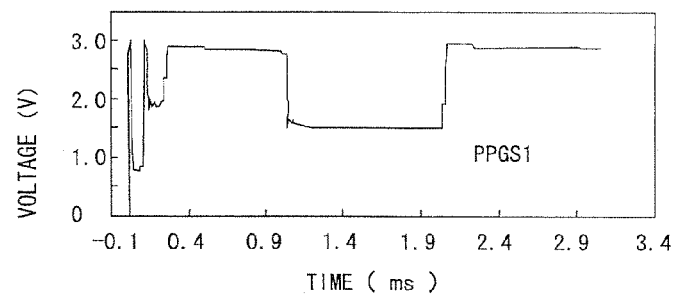

FIG. 19E is a graph exemplifying an operation waveform of a signal PPG1 (i.e., a gate voltage of the PMOS transistor MPP1); FIG. 20A is a graph exemplifying an operation waveform of the node RSTL2; FIG. 20B is a graph exemplifying an operation waveform of a signal NIST; and FIG. 20C is a graph exemplifying an operation waveform of a signal PPGS1 (i.e., a gate voltage of the PMOS transistor MPPS1).

The node (i.e., the signal) RSTL is maintained as H until the node RSTLX shown in FIG. 18D is turned to H. The node RSTL2 remains as H for a certain period even after the node RSTL is turned from H to L. A signal NIST is maintained as H only for the aforementioned certain period remaining the node RSTL2 as H. A signal PPGS1 is maintained at a lower potential during the periods of a signal RSTL being H, a signal NIST being H and a load current flowing than a potential during the other period. A signal PPG1 is maintained at a low potential during the periods when the potential of the signal PPGS1 is low except for the period in which a signal RSTL is maintained as H. Due to this, the configuration is comprehensibly such that the capacitor COUT is charged only by the power on-use amplifier AMPLDS2 during a period of the signal RSTL being H, while an internal power supply voltage VDD is supplied by the two amplifiers AMPPLD2 and AMPPLDS2 during the other period.

Note that the second embodiment is configured to furnish the power on-use amplifier AMPLDS2 for charging the capacitor for each load driving amplifier AMPLD2 for a normal operation; if a configuration, however, comprises a plurality of power supply circuits such as a load driving amplifier AMPLD2, then a power on-use amplifier may not necessary be furnished for every power supply circuit. Meanwhile, if there is only a low necessity of considering for an overcharging of a capacitor COUT, a post-charging discharge-use circuit (i.e., as a circuit constituted by the PMOS transistors MP23 and MP24, NMOS transistor MN33 and resistor RSF1) may not necessarily be furnished.

Third Embodiment

The above described first and second embodiments are configured to constitute a feedback circuit by using the operational amplifier circuit AMPF1. Such a circuit configuration provides a benefit of obtaining a large enough gain of the feedback circuit constituted by the operational amplifier circuit AMPF1 and replica amplifier even when operating the PMOS transistor MPP1 in a linear region (i.e., a voltage between the gate and source of the transistor is amply higher than the one between the drain and source thereof). The reason is that a gain of the entirety of the feedback circuit is the product of a gain of the PMOS transistor MPP1 and that of the replica amplifier, although the gain of the transistor MPP1 drastically reduces in the linear region. This makes it possible to generate a power supply voltage VDD in high accuracy even if the potential difference between the power supply voltages VCC and VDD is small.

Comparably, in the case of not operating the transistor MPP1 in a linear region, it is acceptable if the gain of the entirety of the feedback circuit is small. Having focused on this point, the third embodiment is configured to further simplify a circuit configuration.

Figure 21:
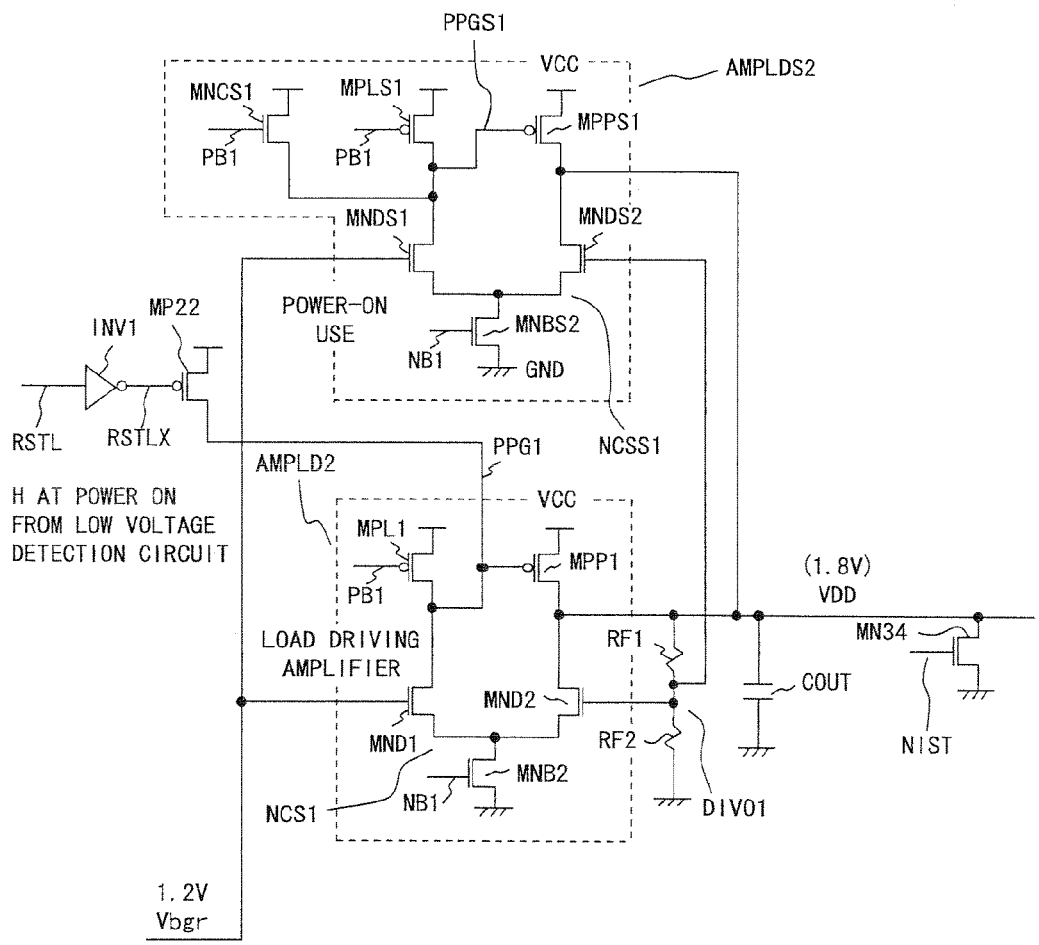
FIG. 21 shows a configuration of a regulator circuit according to a third embodiment.

FIG. 21 shows a configuration of a regulator circuit according to the third embodiment. The third embodiment is accomplished in the form of modifying the second embodiment shown in FIG. 15. The showing of FIG. 21 attaches the same component sign to the same component or fundamentally the same one as that of FIG. 15.

As shown in FIG. 21, the third embodiment is configured to eliminate the replica amplifier AMPLD2R, voltage division circuit (i.e., resistors RF1R and RF2R) connected thereto, operational amplifier circuit AMPF1 and discharge-use circuit (i.e., a circuit as one constituted by the PMOS transistors MP23, MP24, NMOS transistor MN33 and resistor RSF1) from the second embodiment shown in FIG. 15. Also configured is to supply a bandgap voltage Vbgr directly to the gates of respective NMOS transistors MND1 and MNDS1 of two amplifiers AMPLD2 and AMPLDS2. Such a configuration practically operates appropriately in such a case that the transistor MPP1 is not operated in a linear region, thereby further reducing a scale of the regulator circuit without causing a failure and further reducing the production cost.

Note that the third embodiment is configured to eliminate a discharge-use circuit (i.e., a circuit as one constituted by the PMOS transistors MP23, MP24, NMOS transistor MN33 and resistor RSF1), a configuration not eliminating it may be possible. In such a case, a discharge-use circuit suitable to the configuration may be furnished. Also, either the power on-use amplifier AMPLDS2 or control-use circuit for operating the PMOS transistor MPP1 at a time of turning the power on (i.e., the circuit constituted by the inverter circuit INV1 and PMOS transistor MP22) may be eliminated. Or, a configuration eliminating the replica amplifier AMPLD2R and operational amplifier circuit AMPF1 from the circuit configuration shown in FIG. 7 or FIG. 8 may be adopted. As is apparent from these, various modifications are viable.

What is claimed:

1. A regulator circuit comprising:
 a load driving amplifier including a differential pair and configured to output a second signal of a constant power supply voltage and supply a load current through a first output node of the load driving amplifier, the differential pair including a first transistor configured to receive an input of a first signal used as a reference and a second transistor configured to receive an input of a third signal generated on the basis of the second signal the first signal being a signal of a bandgap voltage;

a resistance voltage division circuit configured to generate the third signal from the second signal; and a charging-use amplifier configured to charge a capacitance element through a second output node of the charging-use amplifier in a time period during which the load driving amplifier is in an off state, the capacitance element and the second output node of the charging-use amplifier being electrically connected to the first output node of the load driving amplifier.

2. The regulator circuit according to claim 1, further comprising an output stopping unit configured to stop an output of the second signal from the load driving amplifier during the time period in which the charging-use amplifier charges the capacitance element.

3. The regulator circuit according to claim 2, wherein the time period is one immediately after turning electric power on.

4. The regulator circuit according to claim 1, wherein the charging-use amplifier comprises an electric current control unit for controlling an electric current flowing in the second transistor, in addition to substantially the same configuration as the load driving amplifier.

5. The regulator circuit according to claim 4, wherein the electric current control unit suppresses an increase of an electric current flowing in the second transistor with voltage applied thereto.

6. The regulator circuit according to claim 1, further comprising a discharge unit configured to respond to an over-charging in the capacitance element by making the capacitance element discharge a charged charge therein after completing a charging by the charging-use amplifier.

7. The regulator circuit according to claim 1, wherein the load driving amplifier comprises a current source for making a sum of currents supplied by the differential pair constant.

8. The regulator circuit according to claim 1, wherein an amount of an electric current supplied by the charging-use amplifier is smaller than an amount of an electric current supplied by the load driving amplifier.

* * * * *